US012580568B2

(12) United States Patent
Sautto et al.

(10) Patent No.: US 12,580,568 B2
(45) Date of Patent: Mar. 17, 2026

(54) SCALABLE ARBITER FOR NON-PERSISTENT SIGNALS

(71) Applicant: Renesas Electronics America Inc., Milpitas, CA (US)

(72) Inventors: Marco Sautto, Zurich (CH); Victor Khomenko, Bourne End (GB)

(73) Assignee: Renesas Electronics America Inc., Milpitas, CA (US)

( * ) Notice: Subject to any disclaimer, the term of this patent is extended or adjusted under 35 U.S.C. 154(b) by 44 days.

(21) Appl. No.: 18/800,245

(22) Filed: Aug. 12, 2024

(65) Prior Publication Data

US 2026/0045949 A1 Feb. 12, 2026

(51) Int. Cl.
*H03K 19/20* (2006.01)
*H03K 19/0175* (2006.01)

(52) U.S. Cl.
CPC ..... *H03K 19/017509* (2013.01); *H03K 19/20* (2013.01)

(58) Field of Classification Search
CPC .... H03K 19/0002; H03K 19/20; H03K 3/027; H03K 3/037; H03K 5/15; H03K 5/15013; H03K 5/15026; G06F 13/1605; G06F 13/36; G06F 13/4031
See application file for complete search history.

(56) References Cited

U.S. PATENT DOCUMENTS

| | | | | | |
|---|---|---|---|---|---|
| 5,805,838 | A | * | 9/1998 | Sutherland | G06F 13/364 |
| | | | | | 710/118 |
| 10,581,435 | B1 | * | 3/2020 | Sokolov | H03K 19/20 |
| 11,494,315 | B1 | * | 11/2022 | Janssens | H03K 19/20 |
| 2003/0031197 | A1 | * | 2/2003 | Schmidt | H04L 49/254 |
| | | | | | 710/240 |
| 2008/0215785 | A1 | * | 9/2008 | Satani | G06F 5/12 |
| | | | | | 710/241 |
| 2012/0106334 | A1 | * | 5/2012 | Tanaka | H04L 47/10 |
| | | | | | 370/230 |
| 2013/0326100 | A1 | * | 12/2013 | Bacigalupo | G06F 13/364 |
| | | | | | 710/240 |
| 2014/0281086 | A1 | * | 9/2014 | Bacigalupo | G06F 13/14 |
| | | | | | 710/240 |
| 2023/0238969 | A1 | * | 7/2023 | Gonsholt | H03L 7/14 |
| | | | | | 331/172 |
| 2024/0313748 | A1 | * | 9/2024 | Qadir | G11C 7/1087 |
| 2024/0362035 | A1 | * | 10/2024 | Kesterson | G06F 9/4498 |
| 2025/0070784 | A1 | * | 2/2025 | Sautto | H03K 19/20 |

* cited by examiner

*Primary Examiner* — Jason M Crawford

(74) *Attorney, Agent, or Firm* — SCULLY, SCOTT, MURPHY & PRESSER, P.C.

(57) ABSTRACT

Systems and devices for signal arbitration are described. A plurality of asynchronous circuits can receive a plurality of non-persistent signals representing a plurality of requests and sanitize the plurality of non-persistent signals to generate a plurality of persistent signals. At least one logic circuit can arbitrate the plurality of persistent signals, where each one of the at least one logic circuit can include a mutual exclusive circuit configured to arbitrate two signals. Each logic circuit is one of a first logic circuit, a second logic circuit and a third logic circuit different from one another. A number of copies of the first logic circuit can be implemented in an initial level of arbitration and a number of copies of the second logic circuit and the third logic circuit can be implemented in additional levels of arbitration.

20 Claims, 19 Drawing Sheets

104

104

SCALABLE ARBITER FOR NON-PERSISTENT SIGNALS

BACKGROUND OF THE SPECIFICATION

The present disclosure relates to an arbiter that can be scalable to select a signal among an arbitrary number of signals for processing in a computing system. The signals being selected can be non-persistent signals, such as analog signals outputted by analog circuits.

An arbitration circuit, or an arbiter, can be used for arbitrating multiple requests from multiple clients. At least one of the multiple clients can concurrently send respective requests to the arbiter. The arbiter can issue a grant to a specific client among the multiple clients to fulfill the request submitted by the specific client. At most one grant can be issued by the arbiter at any time, regardless of how many concurrent requests have been received by the arbiter. If the grant is issued to the specific client, the other clients are not allowed to interfere. Having completed the task associated with the issued grant, the arbiter can be reset and then perform arbitration again to issue a grant to a client among the clients with active requests.

SUMMARY

In one embodiment, a semiconductor device for signal arbitration is generally described. The semiconductor device can include a plurality of asynchronous circuits configured to receive a plurality of non-persistent signals representing a plurality of requests and sanitize the plurality of non-persistent signals to generate a plurality of persistent signals. The semiconductor device can further include at least one logic circuit configured to arbitrate the plurality of persistent signals. Each one of the at least one logic circuit can include a mutual exclusive (MUTEX) circuit configured to arbitrate two signals. Each one of at least one logic circuit can be one of a first logic circuit, a second logic circuit and a third logic circuit. The first logic circuit, the second logic circuit and the third logic circuit can be different from one another. The semiconductor device can further include a number of copies of the first logic circuit is implemented in an initial level of arbitration. The semiconductor device can further include a number of copies of the second logic circuit and the third logic circuit are implemented in additional levels of arbitration.

In one embodiment, a system for signal arbitration is generally described. The system can include an analog circuit, a controller and an arbiter. The arbiter can include a plurality of asynchronous circuits configured to receive a plurality of non-persistent signals representing a plurality of requests and sanitize the plurality of non-persistent signals to generate a plurality of persistent signals. The arbiter can further include at least one logic circuit configured to arbitrate the plurality of persistent signals. Each one of the at least one logic circuit can include a mutual exclusive (MUTEX) circuit configured to arbitrate two signals. Each one of at least one logic circuit is one of a first logic circuit, a second logic circuit and a third logic circuit. The first logic circuit, the second logic circuit and the third logic circuit can be different from one another. The arbiter can further include a number of copies of the first logic circuit is implemented in an initial level of arbitration. The arbiter can further include a number of copies of the second logic circuit and the third logic circuit are implemented in additional levels of arbitration. The controller can be configured to control the analog circuit based on arbitration of the plurality of persistent signals.

In one embodiment, a semiconductor device for signal arbitration is generally described. The semiconductor device can include A semiconductor device can include a plurality of input pins configured to receive a plurality of non-persistent signals representing a plurality of requests. The semiconductor device can further include a plurality of asynchronous circuits configured to sanitize the plurality of non-persistent signals to generate a plurality of persistent signals. The semiconductor device can further include at least one logic circuit configured to arbitrate the plurality of persistent signals. Each one of the at least one logic circuit can include a mutual exclusive (MUTEX) circuit configured to arbitrate two signals. The semiconductor device can further include a C-element configured to detect a completion of arbitration performed by the at least one logic circuit and in response to detection of the completion of arbitration performed by the at least one logic circuit, output a signal to reset the at least one logic circuit. The semiconductor device can further include a plurality of grant pins, wherein arbitration of the plurality of persistent signals causes one of the grant pins to output a grant signal. The semiconductor device can further include an OR gate configured to detect one of the grant pins outputted the grant signal and in response to detection of one of the grant pins outputted grant signal, generate a signal to reset the plurality of asynchronous circuits.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
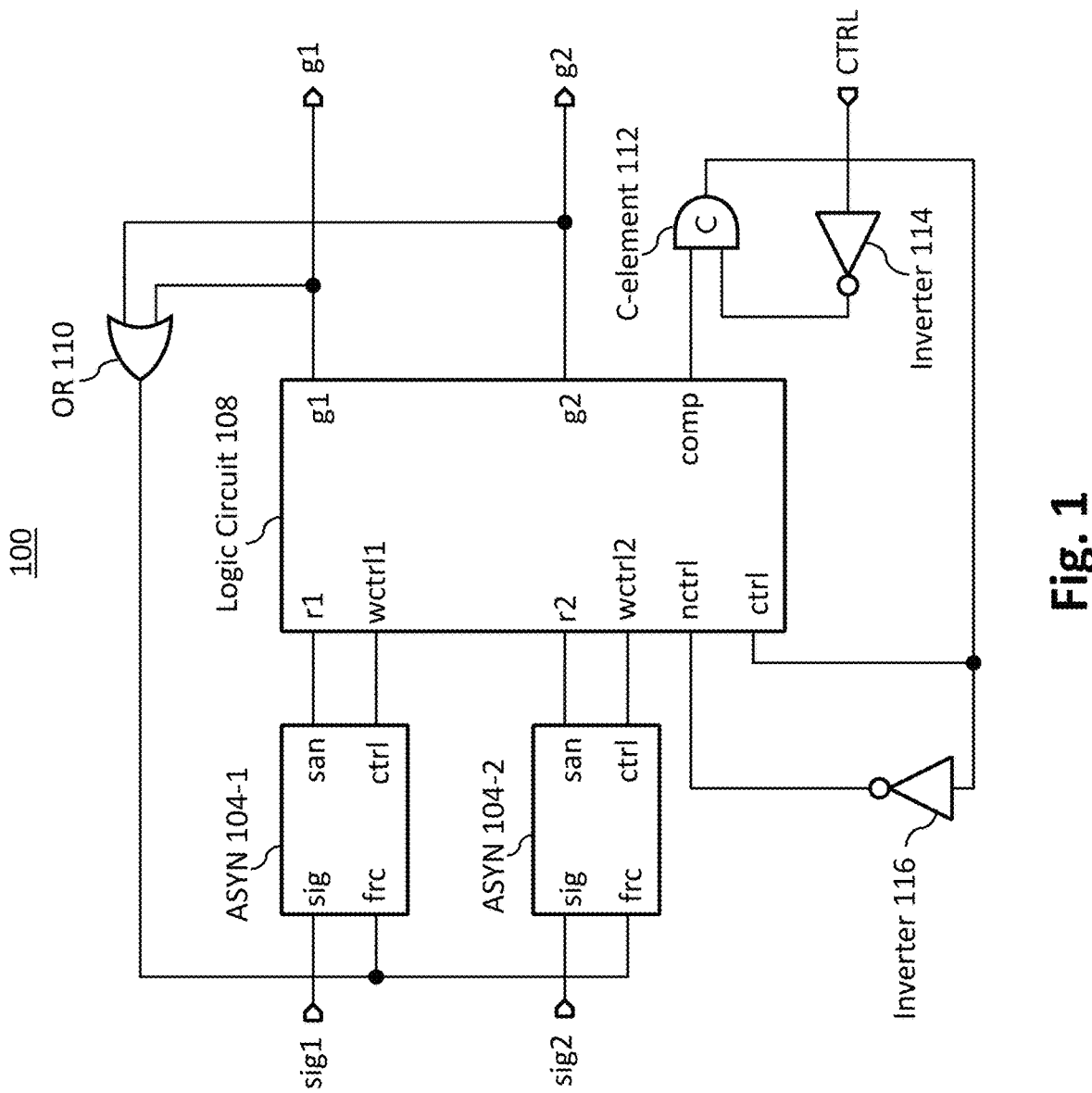
FIG. 1 is a diagram showing a circuit that can implement a scalable arbiter for non-persistent signals in one embodiment.

FIG. 1 is a diagram showing a circuit that can implement a scalable arbiter for non-persistent signals in one embodiment. A circuit 100 shown in FIG. 1 can be implemented by a semiconductor device. Circuit 100 can be an arbitration circuit, or an arbiter, that can be reusable asynchronous component and configured to arbitrate between two requests. The two requests being arbitrated by arbiter 100 can be encoded or represented as non-persistent signals, e.g. signals generated by an analog circuit. Arbiter 100 shown in FIG. 1 can be scaled to arbitrate more than two requests, and the arbitration is between two requests represented by signals sig1 and sig2.

By way of example, arbiter 100 can be used for arbitrating two requests from two clients using a shared resource in a mutually exclusive way. Initially, CTRL input is low and the arbiter is in a dormant state, ignoring inputs sig1 and sig2, and the outputs g1 and g2 are low. When CTRL goes high, a new cycle of arbitration starts. Before accessing the shared resource, a first client can send sig1 to arbiter 100 and the second client can concurrently send sig2 to arbiter 100 to request access to the shared resource. Arbiter 100 can issue a grant signal to grant access of the shared resource to one of sig1 and sig2. If the grant is issued to sig1, then arbiter 100 can raise (e.g., transition from logic low to logic high) a grant signal g1 while keeping grant signal g2 low. If the grant is issued to sig2, then arbiter 100 can raise g2 while keeping g1 low. Hence, the grant signals g1 and g2 can be mutually exclusive, which reflects that arbiter 100 can grant at most one request at one time. After the grant signal is issued, the grant outputs are stable irrespective of the behavior of non-persistent inputs sig1 and sig2. To complete the cycle of arbitration, the input CTRL goes down, and in response the arbiter lowers the winning grant g1 or g2, going back to the dormant state. After that, a new cycle of arbitration can start.

In an aspect, some conventional arbiters are configured to process requests represented by persistent or well-behaved signals, such as purely digital signals and signals representing requests that will not be withdrawn prematurely (e.g., before the arbitration is completed and the corresponding grant is issued). However, arbiters for processing well-behaved request signals can be restrictive because they may not be suitable to process requests produced by analog circuitry. For example, requests that are outputs of voltage comparators implemented using differential amplifiers can include undesirable short pulses generated due to noise if the voltages being compared are relatively close (e.g., comparator input voltage relatively small). Such requests produced by analog circuitry can be referred to as non-persistent signals.

In one embodiment, signals sig1 and sig2 received by arbiter 100 can be non-persistent signals (e.g., opposite from well-behaved signals), where these non-persistent signals can be withdrawn at any moment, have hazards (e.g., glitches, high-frequency bursts and jitters), signals produced by analog circuitry (e.g., voltage comparators), or other signals that are not purely digital signals or not guaranteed to follow any protocol. In other words, sig1 and sig2 can change their values at any time without any restrictions.

To arbitrate two or more non-persistent signals, conventional arbiters may be limited in terms of scalability. Some conventional arbiter scaling schemes can be limited by designs that would include custom gates that may not be available in commonly used gate libraries. Libraries of logic gates are finite and so the logic gates have fixed sizes, such that one cannot have AND-gates or OR-gates with arbitrary number of inputs, and breaking up a gate into smaller ones (e.g. an AND3 gate into a pair of AND2 gates) may violate the quasi delay-insensitive (QDI) properties. Some other conventional arbiters' scalability can be dependent on the existence of an N-way arbiter (e.g., N being number of requests) for persistent signals that allows the early withdrawal of losing requests, but such an N-way arbiter are typically unspecified. The reliance on N-way arbiters that are unspecified can limit the scalability of arbiter designs to arbitrate relatively large number of requests, such as more than two requests (e.g., N≥2). For example, to scale from arbitrating two requests to three requests, the 2-way arbiter will be replaced by a 3-way arbiter that needs to be designed.

To be described herein, an arbiter architecture is disclosed for a scalable arbitrary number of requests. The arbiter architecture described herein can retain low latency and area advantage, and is fully specified. The arbiter architecture described herein is relatively simple to scale for arbitrating additional inputs and can be constructed using common or known gate libraries. The ability to be scaled to more inputs with relatively low latency on the critical paths can lead to improvements in hardware using the arbiter. For example, power management integrated circuits (PMIC) conversion efficiency can be improved since the controller of the PMIC can react relatively quickly to analog conditions, such as undervoltage, overcurrent, zero-crossing, and mode change request. The arbiter architecture described herein can be implemented using different arrangements of copies of a known set of logic circuit blocks that include mutual exclusion circuits, referred to as MUTEX circuits, that arbitrates between two persistent signals. The use of copies of the same set of logic circuit blocks can provide a fully specified architecture instead of having to replace arbiters of different number of inputs and outputs when scaling to arbitrate different requests.

In the embodiment shown in FIG. 1, arbiter 100 can include a plurality of asynchronous circuits ("ASYN") 104, a logic circuit 108, an OR gate 110, a C-element 112 and inverters 114, 116. In one embodiment, the number of asynchronous circuits 104 can be equivalent to the number of inputs. As shown in FIG. 1, arbiter 100 can include two asynchronous circuits 104 for arbitrating two requests represented by signals sig1, sig2. The two asynchronous circuits 104 of arbiter 100 are labeled as ASYN 104-1 and ASYN 104-2. When one of the requests is granted, one of the g1 and g2 pins of arbiter 100 will be high and OR gate 110 will output a high signal to the frc pins of asynchronous circuits 104 to force reset the asynchronous circuits 104. The C-element 112 (and other C-elements described herein) can be a binary logic circuit also known as the Muller C-element that can output a zero or low signal when all of its inputs are zero or low, and outputs one or high when all of its inputs are one or high, and otherwise retains its output state. In one embodiment, when all inputs to C-element 112 are high, C-element 112 can output a high or binary one to reset logic circuit 108. In the descriptions herein, zero, binary zero or low can be considered as logic-0 and one, binary one or high can be considered as logic-1.

Asynchronous circuits 104 can be configured to sanitize non-persistent signals sig1 and sig2 prior to arbitration is performed by logic circuit 108. Asynchronous circuit 104-1 can be configured to clean or sanitize sig1 and Asynchronous circuit 104-2 can be configured to sanitize sig2 prior to logic circuit 108 arbitrates between signals representing sanitized versions of sig1, sig2. In an aspect, the sanitization performed by asynchronous circuits 104 can prevent hazards (e.g., glitches, undesired pulses, etc.) in non-persistent signals from being propagated to the r1 and r2 pins of logic circuit 108. Further, asynchronous circuits 104 can also be configured to process persistent or well-behaved signals, such that arbiter 100 can arbitrate both persistent (well behaved) and non-persistent signals.

Logic circuit 108 can be an asynchronous circuit including a MUTEX circuit that arbitrates two signals and various logic gates for controlling signals internal to logic circuit 108. Logic circuit 108 can receive the sanitized signals from asynchronous circuits 104 at the input pins r1, r2. Logic circuit 108 can be configured to arbitrate between the two sanitized signals received at pins r1 and r2. Logic circuit 108 can include two pins g1 and g2 for outputting grant signals g1 and g2. Logic circuit 108 can include pin comp for indicating the completion. Details of logic circuit 108 will be described further below.

A CTRL pin of arbiter 100 can receive a control signal for controlling the wctrl1, wctrl2, ctrl and nctrl pins of logic circuit 108. The signals at wctrl1 and wctrl2 pins can drive the ctrl pins of asynchronous circuits 104. The ctrl pins of asynchronous circuits 104 can control whether asynchronous circuits 104 operate in dormant mode or waiting mode. In one embodiment, when the ctrl pin of an asynchronous circuit 104 is low or zero, asynchronous circuit 104 can operate in dormant mode where asynchronous circuit 104 can remain idled and ignore signal events, such as rising and falling transitions, at its sig pin. In one embodiment, when the ctrl pin of an asynchronous circuit 104 is high or has a voltage representing high, asynchronous circuit 104 can operate in waiting mode where asynchronous circuit 104 can wait for the signal at its sig input pin to have a specific predefined signal condition or event. Various signal events under the waiting mode will be described in more detail below.

In one embodiment, to scale arbiter 100 to arbitrate more than two inputs, additional copies of asynchronous circuits 104 can be added. Further, with the additional asynchronous circuits 104, additional copies of logic circuits 108, or other logic circuit blocks that include MUTEX circuit for arbitrating two input signals, can be added to control the additional copies of asynchronous circuits 104. The various types of logic circuit blocks including MUTEX circuit for scaling arbiter 100 to arbitrate additional inputs will be described in more detail below.

Figure 2:
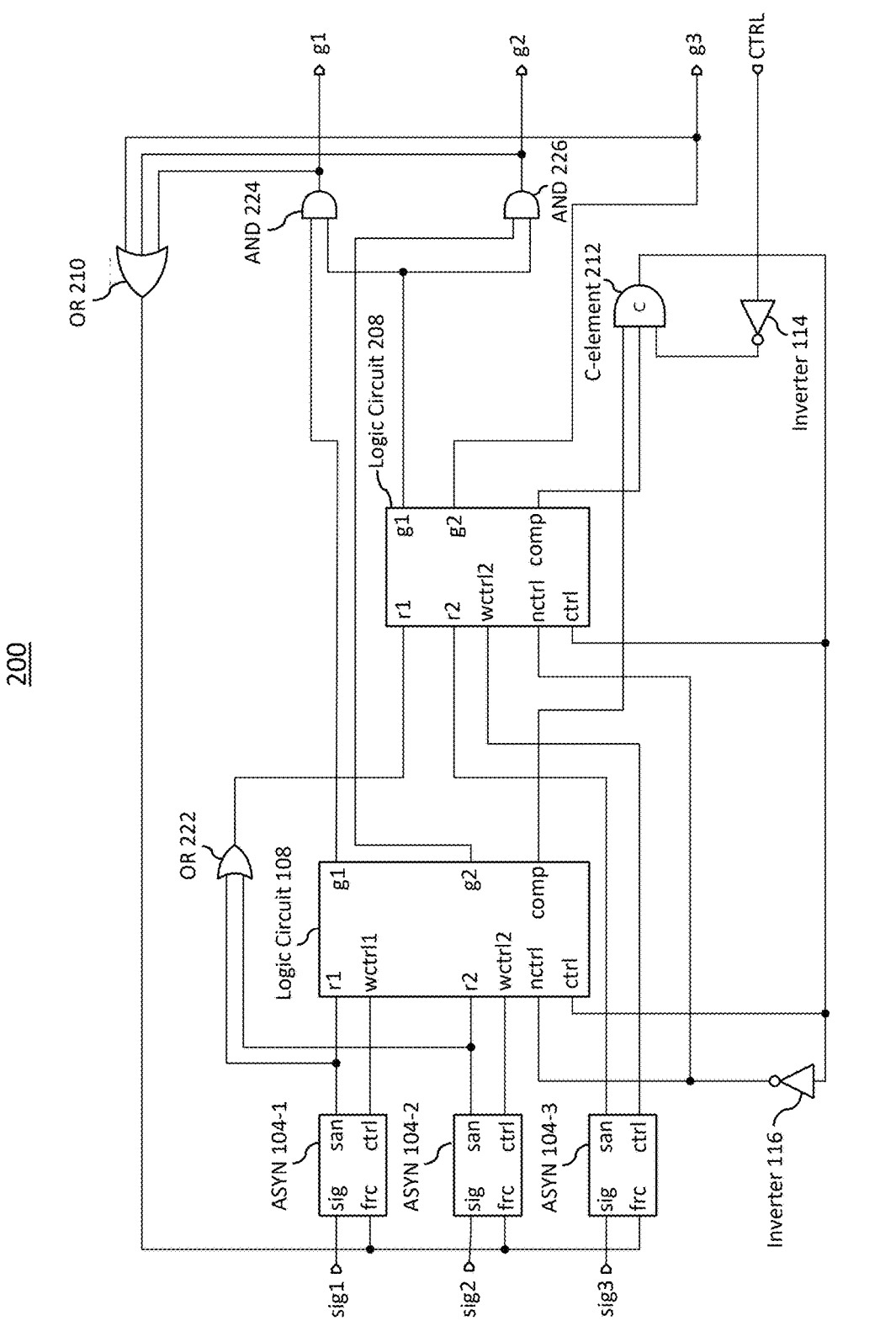
FIG. 2 is a diagram showing another circuit that can implement a scalable arbiter for non-persistent signals in one embodiment.

FIG. 2 is a diagram showing another circuit that can implement a scalable arbiter for non-persistent signals in one embodiment. Description of FIG. 2 can reference components that are shown in FIG. 1. A circuit 200 shown in FIG. 2 can be implemented by a semiconductor device. Circuit 200 can be an arbitration circuit, or an arbiter, that can be a reusable asynchronous component and configured to arbitrate between three requests. The three requests sig1, sig2, sig3 being arbitrated by arbiter 200 can be encoded or represented as non-persistent signals, e.g. signals generated by an analog circuit. The three asynchronous circuits 104 of arbiter 200 are labeled as asynchronous circuits 104-1, 104-2, 104-3.

By way of example, arbiter 200 can be used for arbitrating three requests from three clients using a shared resource in a mutually exclusive way. Arbiter 200 can grant at most one request at one time. If arbiter 200 issued grant to sig1, after the client that submitted sig1 accessed the shared resource, CTRL can be withdrawn by transitioning from high to low and arbiter 200 can withdraw the grant g1 by dropping g1 from high to low.

In the embodiment shown in FIG. 2, arbiter 200 can include a plurality of asynchronous circuits 104, logic circuit 108, inverters 114, 116, an OR gate 210, a C-element 212, an OR gate 222, and AND gate 224, an AND gate 226 and a logic circuit 208. In one embodiment, when all inputs to C-element 212 are high, C-element 212 can output a high or binary one to reset logic circuit 108 and logic circuit 208. Arbiter 200 can include three asynchronous circuits 104 for sanitizing three requests represented by signals sig1, sig2, sig3 which may be non-persistent. Comparing arbiter 200 to arbiter 100 of FIG. 1, to scale arbiter 100 to arbitrate three inputs, one copy of asynchronous circuit 104, logic circuit 208 and additional basic logic gates such as OR gates and AND gates are added. When one of the requests is granted, one of the g1, g2 and g3 pins of arbiter 200 will be high and OR gate 210 will output a high signal to the frc pins of asynchronous circuits 104 to reset the asynchronous circuits 104.

In one embodiment, signals sig1, sig2 and sig3 received by arbiter 200 can be non-persistent signals (e.g., opposite from well-behaved signals), where these non-persistent signals can be withdrawn at any moment, have hazards (e.g., glitches, high-frequency bursts and jitters), signals produced by analog circuitry (e.g., voltage comparators), or other signals that are not purely digital signals or are not guaranteed to follow a pre-defined protocol. In other words, sig1, sig2 and sig3 can change their values at any time without any restrictions.

Asynchronous circuits 104-1, 104-2 can be configured to sanitize non-persistent signals sig1 and sig2 prior to logic circuit 108 arbitrating sig1, sig2. Asynchronous circuits 104-3 can be configured to sanitize sig3 prior to logic circuit 208 arbitrating sig3 and an output of OR gate 222. In an aspect, the sanitization performed by asynchronous circuits 104 can prevent hazards (e.g., glitches, undesired pulses, etc.) from being propagated to the r1 and r2 pins of logic circuits 108 and 208. Further, asynchronous circuits 104 can also be configured to process persistent or well-behaved signals, such that arbiter 200 can arbitrate both persistent (well behaved) and non-persistent signals, or any combination of persistent and non-persistent signals. Asynchronous circuits 104 can output the sanitized signals as persistent signals at their respective san pins.

Logic circuit 208 can be an asynchronous circuit including a MUTEX circuit that arbitrates two signals and various logic gates for controlling signals internal to logic circuit 208. Logic circuit 208 can receive the sanitized signals from asynchronous circuit 104-3 and the output from OR gate 222 on its input pins r1, r2. Logic circuit 208 can be configured to arbitrate between the sanitized signal from asynchronous circuit 104-3 and the output of OR gate 222. Logic circuit 208 can include two pins g1 and g2 for outputting internal grant signals g1 and g2 to AND gates 224, 226. The AND gates 224, 226 can also receive the outputs from the grant pins of logic circuit 108 to output a grant signal for arbiter 200. Logic circuit 208 includes different components from logic circuit 108 and details of logic circuit 208 will be described further below.

The wctrl2, ctrl and nctrl pins of logic circuit 208 can be controlled by the CTRL signal received by arbiter 200. The signal at the wctrl2 pin of logic circuit 208 can drive the ctrl pin of asynchronous circuit 104-3. The ctrl pin of asynchronous circuit 104-3 can control whether asynchronous circuit 104-3 operate in dormant mode.

When three requests are received by arbiter 200 concurrently, sig1, sig2, sig3 will have binary high values, hence the san pin outputs from asynchronous circuits 104-1, 104-2, 104-3 are also binary high values. Outputs from asynchronous circuits 104-1, 104-2 can be provided to OR gate 222 and logic circuit 108, and the output from asynchronous circuit 104-3 can be provided to logic circuit 208. Logic circuit 108 can arbitrate the outputs from asynchronous circuits 104-1, 104-2 that are received at its r1, r2 pins. When signals sig1, sig2, sig3 are received by arbiter 200 concurrently, the output of OR gate 222 will be high and logic circuit 208 will receive high signals at both the r1 pin and the r2 pin of logic circuit 208. Logic circuit 208 can arbitrate the signals received at the r1, r2 pins.

In a first example, logic circuit 108 issues grant to sig1 such that the g1 pin of logic circuit 108 will be high and the g2 pin of logic circuit 108 will be low. Logic circuit 208 issues grant to r1 (e.g., the output of OR gate 222), such that the g1 pin of logic circuit 208 will be high and the g2 pin of logic circuit 208 will be low. Thus, AND gate 224 will receive two high inputs. AND gate 226 will receive a low signal from logic circuit 108 and a high signal from logic circuit 208. AND gate 224 will output a binary high at the g1 pin of arbiter 200 and AND gate 226 will output a binary low or zero at the g2 pin of arbiter 200. Since the g2 pin of logic circuit 208 is low or zero, the g3 pin of arbiter 200 will be a zero as well.

In a second example, logic circuit 108 issues grant to sig1 such that the g1 pin of logic circuit 108 will be high and the g2 pin of logic circuit 108 will be low. Logic circuit 208 issues grant to r2, or sig3, such that the g2 pin of logic circuit 208 will be high and the g1 pin of logic circuit 208 will be low. Thus, AND gate 224 will receive a high signal from logic circuit 108 and a low signal from logic circuit 208. AND gate 226 will receive two low inputs. AND gate 224 will output a binary low at the g1 pin of arbiter 200 and AND gate 226 will output a binary low or zero at the g2 pin of arbiter 200. Since the g2 pin of logic circuit 208 is high, the g3 pin of arbiter 200 will be a high signal as well.

In one embodiment, if one of sig1 and sig2 is high (the other one being low) and sig3 is also high, then OR gate 222 will still output a high signal and logic circuit 208 can arbitrate the two high signals received at the r1, r2 pins. If sig3 is a low signal (e.g., no request from third client), and sig1, sig2 are high signals, then logic circuit 208 will issue grant to the r1 by default and arbiter 200 will issue grant to the signal granted by logic circuit 108. OR gate 110 is replaced by three-input OR gate 210 and C-element 112 is replaced by three-input C-element 212.

Comparing arbiter 200 to arbiter 100 in FIG. 1, when there are odd number of requests (e.g., N being odd number) for arbitration, the arbiter architecture described herein can use (N−1)/2 copies of logic circuit 108 to perform a first level of arbitration to filter out (N−1)/2 requests. Also, for odd number of requests, additional levels of arbitration can be performed using copies of logic circuit 208. Implementation of the arbiter architecture described herein for odd number of input requests larger than three will be described and shown in more detail below. Further, the addition of OR gate 222 can propagate outputs from asynchronous circuits 104-1 and 104-2 to logic circuit 208 while logic circuit 108 is performing its arbitration. Hence, OR gate 222 can provide early propagation of signals to later arbitration levels.

Figure 3:
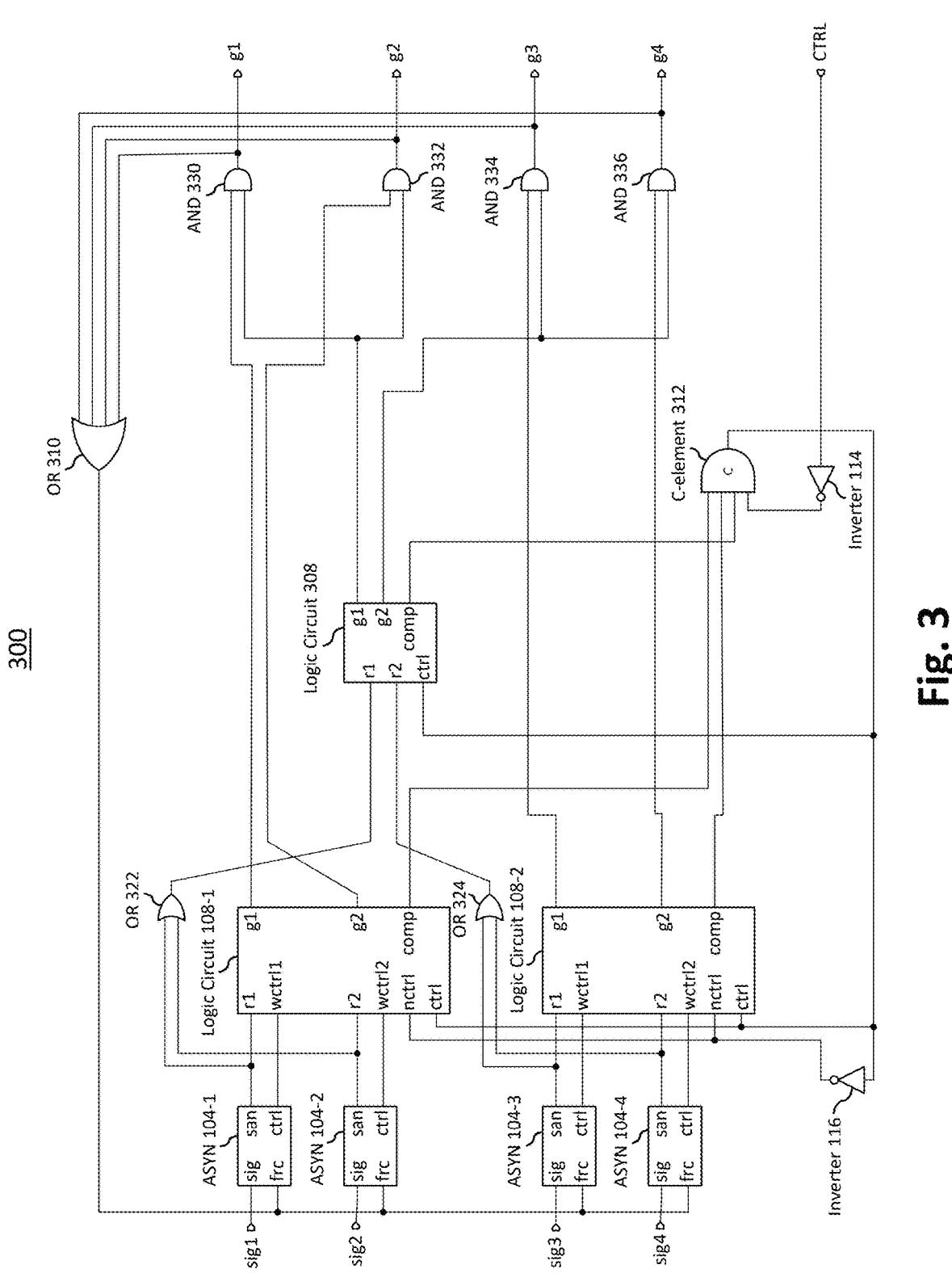
FIG. 3 is a diagram showing another circuit that can implement a scalable arbiter for non-persistent signals in one embodiment.

FIG. 3 is a diagram showing another circuit that can implement a scalable arbiter for non-persistent signals in one embodiment. Description of FIG. 3 can reference components that are shown in FIG. 1 and FIG. 2. A circuit 300 shown in FIG. 3 can be implemented by a semiconductor device. Circuit 300 can be an arbitration circuit, or an arbiter, that can be a reusable asynchronous component and configured to arbitrate between four requests. The four requests sig1, sig2, sig3, sig4 being arbitrated by arbiter 300 can be encoded or represented as non-persistent signals, e.g. signals generated by an analog circuit. The four asynchronous circuits 104 of arbiter 300 are labeled as asynchronous circuits 104-1, 104-2, 104-3, 104-4.

By way of example, arbiter 300 can be used for arbitrating four requests from four clients using a shared resource in a mutually exclusive way. Arbiter 300 can grant at most one request at one time. If arbiter 300 issued grant to sig1, after the client that submitted sig1 accessed the shared resource, CTRL can be withdrawn by transitioning from high to low and arbiter 300 can withdraw the grant g1 by dropping g1 from high to low.

In the embodiment shown in FIG. 3, arbiter 300 can include a plurality of asynchronous circuits 104, two copies of logic circuit 108, inverters 114, 116, an OR gate 310, a C-element 312, an OR gate 322, an OR gate 324, AND gates 330, 332, 334, 336 and a logic circuit 308. OR gates 322, 324 can propagate request signals to logic circuits in later arbitration levels. In one embodiment, when all inputs to C-element 312 are high, C-element 312 can output a high or binary one to reset logic circuits 108-1, 108-2, 308. Arbiter 300 can include four asynchronous circuits 104 for arbitrating four requests represented by signals sig1, sig2, sig3, sig4. Comparing arbiter 300 to arbiter 100 of FIG. 1, to scale arbiter 100 to arbitrate four inputs, two copies of asynchronous circuits 104, one copy of logic circuit 108, logic circuit 208 and additional basic logic gates such as OR gates and AND gates are added. When one of the requests is granted, one of the g1, g2, g3 and g4 pins of arbiter 300 will be high and OR gate 310 will output a high signal to the frc pins of asynchronous circuits 104 to reset the asynchronous circuits 104.

In one embodiment, signals sig1, sig2, sig3 and sig4 received by arbiter 300 can be non-persistent signals (e.g., opposite from well-behaved signals), where these non-persistent signals can be withdrawn at any moment, have hazards (e.g., glitches, high-frequency bursts and jitters), signals produced by analog circuitry (e.g., voltage comparators), or other signals that considered as dirty or not clean, or not purely digital signals. Further, sig1, sig2, sig3 and sig4 can change their values at any time without any restrictions.

Asynchronous circuits 104-1, 104-2 can be configured to clean or sanitize non-persistent signals sig1 and sig2 prior to logic circuit 108-1 arbitrating sig1, sig2. Asynchronous circuits 104-3, 104-4 can be configured to clean or sanitize non-persistent signals sig3 and sig4 prior to logic circuit 108-2 arbitrating sig3, sig4. In an aspect, the cleaning performed by asynchronous circuits 104 can prevent hazards (e.g., glitches, undesired pulses, etc.) in non-persistent signals from being propagated to the r1 and r2 pins of logic circuit 108. Further, asynchronous circuits 104 can also be configured to process persistent or well-behaved signals, such that arbiter 300 can arbitrate both persistent (well behaved) and non-persistent signals, or any combination thereof. Asynchronous circuits 104 can output the sanitized signals as persistent signals at their respective san pins.

Logic circuit 308 can be an asynchronous circuit including a MUTEX circuit that arbitrates two signals and various logic gates for controlling signals internal to logic circuit 308. Logic circuit 308 can receive the outputs of OR gates 322, 324 at its r1, r2 pins. Logic circuit 308 can be configured to arbitrate the outputs of OR gates 322, 324. Logic circuit 208 can include two pins g1 and g2 for outputting internal grant signals g1 and g2 to AND gates 330, 332, 334, 336. The AND gates 330, 332, 334, 336 can also receive the outputs from the grant pins of logic circuits 108-1, 108-2, to output a grant signal for arbiter 300. The ctrl pin of logic circuit 308 can be controlled by the CTRL signal received by arbiter 300 via inverter 114 and C-element 312. Logic circuit 308 includes different components from logic circuit 108 and logic circuit 308, and details of logic circuit 308 will be described further below.

When four requests are received by arbiter 300 concurrently, sig1, sig2, sig3, sig4 will have binary high values, hence the san pin outputs from asynchronous circuits 104-1, 104-2, 104-3, 104-4 are also binary high values. Outputs from asynchronous circuits 104-1, 104-2 can be provided to OR gate 322 and to the r1, r2 pins of logic circuit 108-1. Outputs from asynchronous circuits 104-3, 104-4 can be provided to OR gate 324 and to the r1, r2 pins of logic circuit 108-2. Logic circuit 108-1 can arbitrate the outputs from asynchronous circuits 104-1, 104-2 that are received at its r1, r2 pins. Logic circuit 108-2 can arbitrate the outputs from asynchronous circuits 104-3, 104-4 that are received at its r1, r2 pins. When signals sig1, sig2, sig3, sig4 are received by arbiter 300 concurrently, the outputs of OR gates 322, 324 will be high and logic circuits 108-1, 108-2 will receive high signals at their r1, r2 pins. The outputs from OR gates 322, 324 can be provided to the r1, r2 pins of logic circuit 308. Logic circuit 308 can arbitrate the signals received at its r1, r2 pins.

In a first example, logic circuit 108-1 issues grant to sig1 such that the g1 pin of logic circuit 108-1 will be high and the g2 pin of logic circuit 108-1 will be low. Logic circuit 108-2 issues grant to sig3 such that the g1 pin of logic circuit 108-2 will be high and the g2 pin of logic circuit 108-2 will be low. If logic circuit 308 issues grant to r1 (e.g., the output of OR gate 322), then the g1 pin of logic circuit 308 will be high and the g2 pin of logic circuit 308 will be low. Thus, AND gate 330 will receive two high inputs from the g1 pins of logic circuit 108-1 and logic circuit 308, and will output a high at the g1 pin of arbiter 300. The other AND gates 332, 334, 336 will receive a low signal from pin g2 of logic circuit 308 or from pin g2 of logic circuit 108-1 and output a zero regardless of the other input, thus keeping the g2, g3, g4 pins of arbiter 300 low.

In a second example, logic circuit 108-1 issues grant to sig2 such that the g2 pin of logic circuit 108-1 will be high and the g1 pin of logic circuit 108-1 will be low. Logic circuit 108-2 issues grant to sig3 such that the g1 pin of logic circuit 108-2 will be high and the g2 pin of logic circuit 108-2 will be low. If logic circuit 308 issues grant to r1 (e.g., the output of OR gate 322), then the g1 pin of logic circuit 308 will be high and the g2 pin of logic circuit 308 will be low. Thus, AND gate 332 will receive two high inputs from the g2 pin of logic circuit 108-1 and from the g1 pin of logic circuit 308, and will output a high at the g2 pin of arbiter 300. The other AND gates 330, 334, 336 will receive a low signal from pin g2 of logic circuit 308 or from pin g1 of logic circuit 108-1 and output a zero regardless of the other input, thus keeping the g1, g3, g4 pins of arbiter 300 low.

Comparing arbiter 300 to arbiter 200 in FIG. 2, when there are even number of requests (e.g., N being an even number) for arbitration, the arbiter architecture described herein can use N/2 copies of logic circuit 108 to perform a first level of arbitration to filter out N/2 requests. Also, for even number of requests, additional levels of arbitration can be performed using copies of logic circuit 308. Implementation of the arbiter architecture described herein for even number of input requests larger than four will be described and shown in more detail below. The addition of OR gates 322, 324 can propagate outputs from asynchronous circuits 104 to logic circuits in the later arbitration levels while arbitration is being performed at the first level. Hence, OR gates 322, 324 can provide early propagation of signals to later arbitration levels.

Figure 4:
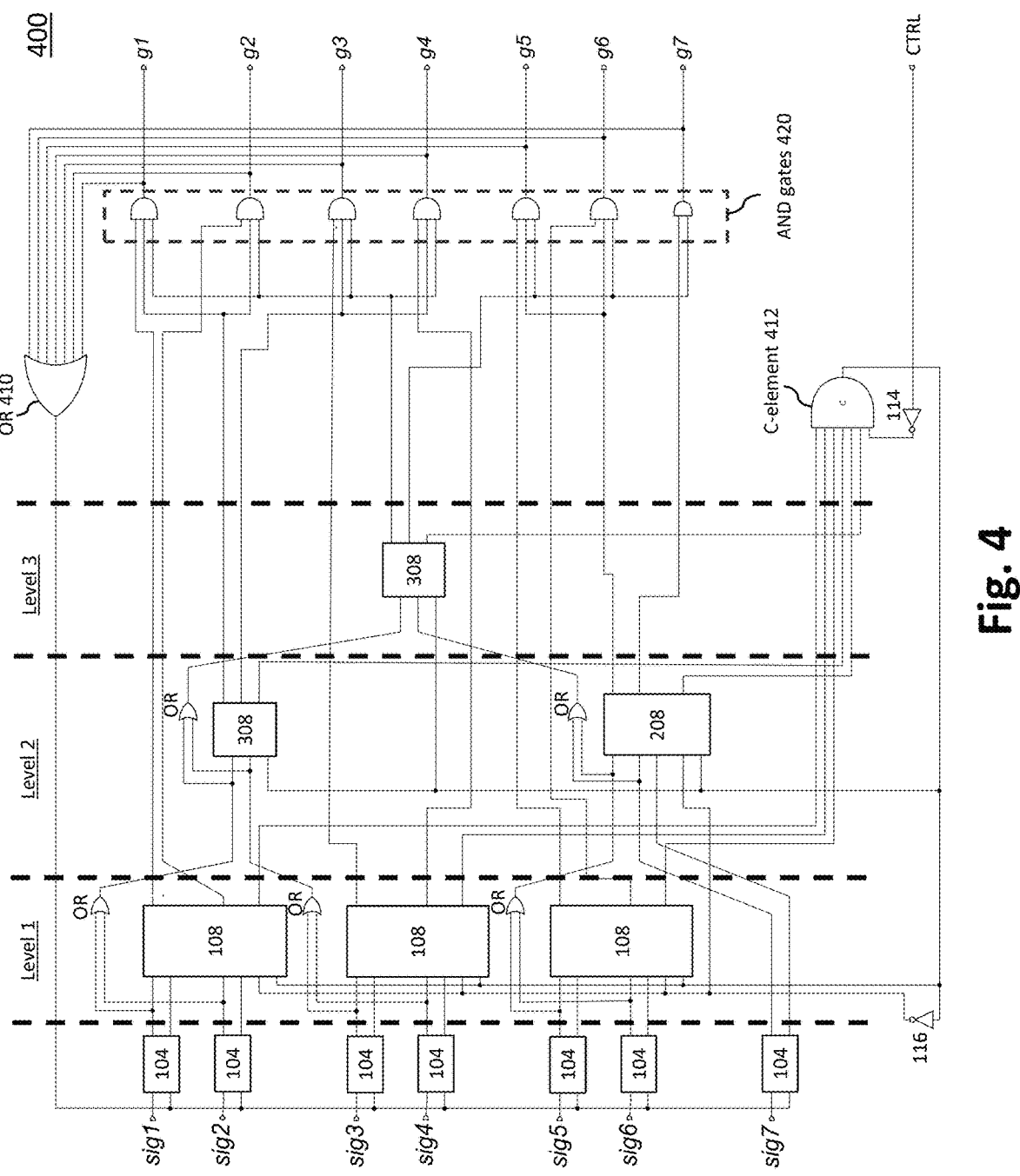
FIG. 4 is a diagram showing another circuit that can implement a scalable arbiter for non-persistent signals in one embodiment.

FIG. 4 is a diagram showing another circuit that can implement a scalable arbiter for non-persistent signals in one embodiment. Description of FIG. 4 can reference components that are shown in FIG. 1 and FIG. 3. A circuit 400 shown in FIG. 4 can be implemented by a semiconductor device. Circuit 400 can be an arbitration circuit, or an arbiter, that can be a reusable asynchronous component and configured to arbitrate between seven requests. The seven requests sig1 to sig7 being arbitrated by arbiter 400 can be encoded or represented as non-persistent signals, e.g. signals generated by an analog circuit. By way of example, arbiter 400 can be used for arbitrating seven requests from seven clients using a shared resource in a mutually exclusive way. Arbiter 400 can grant at most one request at one time.

In the embodiment shown in FIG. 4, arbiter 400 can include a plurality of asynchronous circuits 104, three copies of logic circuit 108, inverters 114, 116, an OR gate 410, a C-element 412, an early propagation tree of OR gates, a plurality of AND gates connected to the grant pins g1 to g7 of arbiter 400, one copy of logic circuit 208 and two copies of logic circuit 308. Three OR gates in arbitration level 1 and two OR gates in arbitration level 2 form the early propagation tree of OR gates to propagate request signals to later arbitration levels. In one embodiment, when all inputs to C-element 412 are high, C-element 412 can output a high or binary one to reset all copies of logic circuits 108, 208, 308. Arbiter 400 can include seven asynchronous circuits 104 for arbitrating seven requests represented by signals sig1 to sig7. When one of the requests is granted, one of the g1 to g7 pins of arbiter 400 will be high and OR gate 410 will output a high signal to the frc pins of asynchronous circuits 104 to reset the asynchronous circuits 104.

In one embodiment, signals sig1 to sig7 received by arbiter 400 can be non-persistent signals (e.g., opposite from well-behaved signals), where these non-persistent signals can be withdrawn at any moment, have hazards (e.g., glitches, high-frequency bursts and jitters), signals produced by analog circuitry (e.g., voltage comparators), or other signals that considered as dirty or not clean, or not purely digital signals. Further, sig1 to sig7 can change their values at any time without any restrictions.

Comparing arbiter 400 to arbiter 200 in FIG. 2, arbiter 400 arbitrates an odd number (e.g., seven) of requests similar to arbiter 200 (e.g., three requests). For the odd number of requests, arbiter 400 may include (N−1)/2=3 copies of logic circuit 108, with N=7, to perform a first level of arbitration to filter out (N−1)/2=3 requests ("Level 1" of arbiter 400 in FIG. 4). As shown in FIG. 4, after the first level of arbitration, three candidate requests can be granted by the three copies of logic circuits 108. The resulting intermediate grants can be provided to AND gates 420. One more candidate request can be outputted from the asynchronous circuit 104 sanitizing sig7. The logic circuits 308, 208 at Level 2 can arbitrate the sanitized version of sig7 produced by the corresponding asynchronous circuit 104 and the outputs of OR gates within Level 1and output the intermediate grant signals to AND gates 420. Logic circuit 308 in Level 3 of arbiter 400 can arbitrate the outputs of the OR gates within Level 2 and output intermediate grant signals to AND gates 420. Note that in arbiter 400 shown in FIG. 4, logic circuit 208 is being used for arbitrating two requests that were processed by an OR gate and a copy of asynchronous circuit 104. Also, logic circuit 308 is being used for arbitrating two requests that were processed by two OR gates. The tree of OR gates shown in FIG. 4 can be configured to perform early propagation of outputs from asynchronous circuits 104 to subsequent arbitration levels while arbitration is being concurrently performed.

Figure 5A:
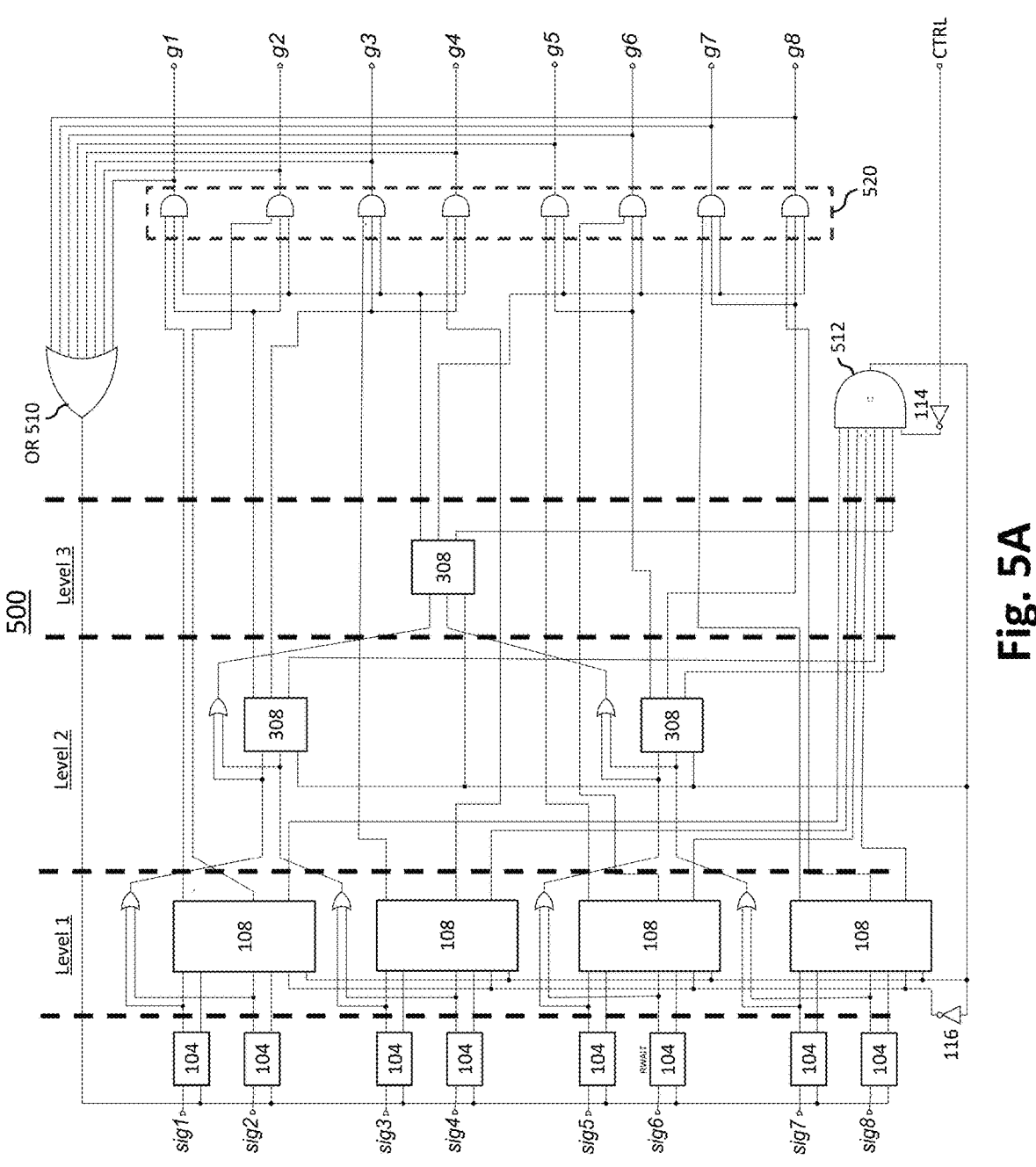
FIG. 5A is a diagram showing another circuit that can implement a scalable arbiter for non-persistent signals in one embodiment.
Figure 5B:
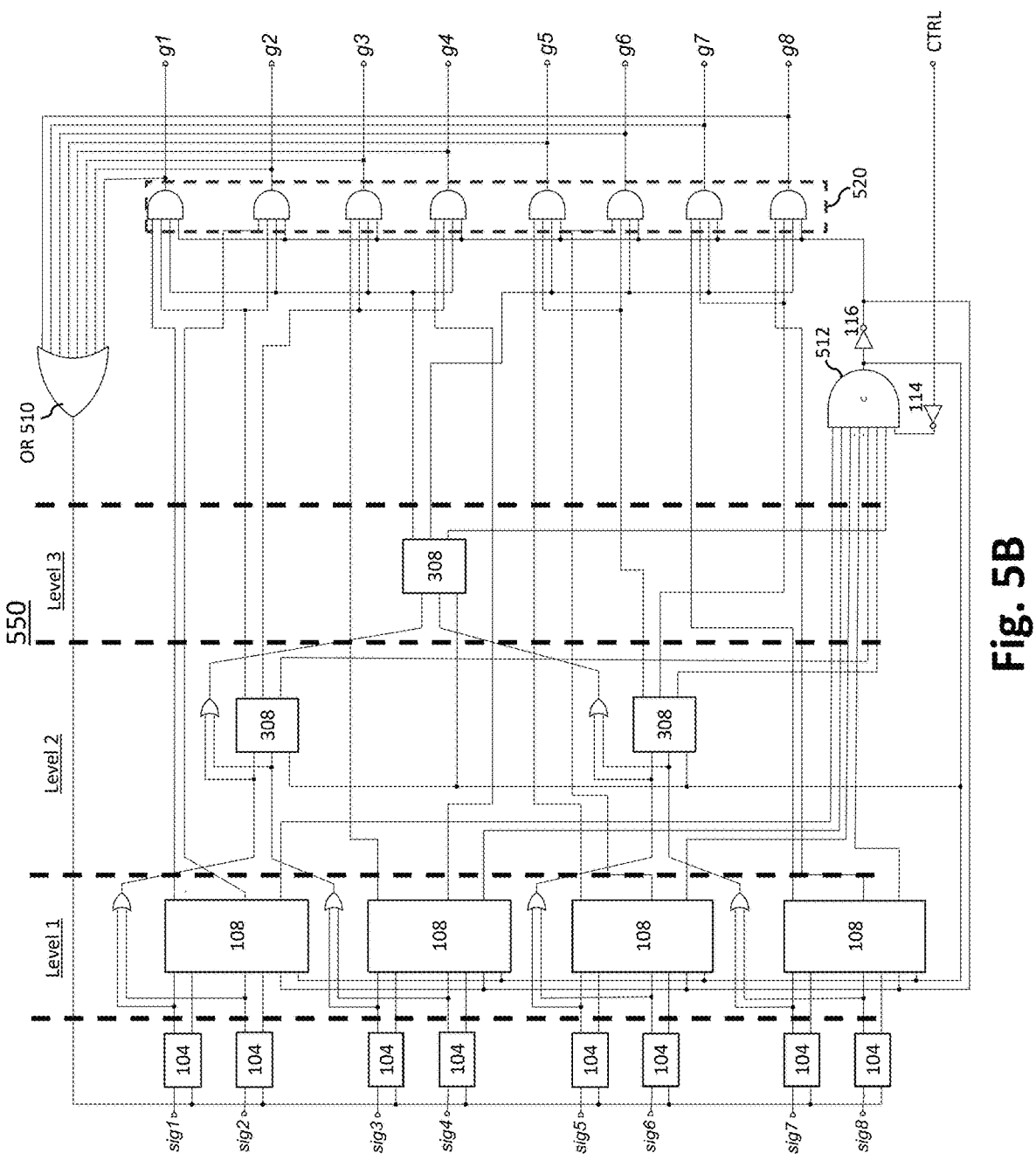
FIG. 5B is a diagram showing another circuit that can implement a scalable arbiter for non-persistent signals in one embodiment.

FIG. 5A is a diagram showing another circuit that can implement a scalable arbiter for non-persistent signals in one embodiment. Description of FIG. 5A can reference components that are shown in FIG. 1 and FIG. 4. A circuit 500 shown in FIG. 5A can be implemented by a semiconductor device. Circuit 500 can be an arbitration circuit, or an arbiter, that can be a reusable asynchronous component and configured to arbitrate between eight requests. The eight requests sig1 to sig8 being arbitrated by arbiter 500 can be encoded or represented as non-persistent signals, e.g. signals generated by an analog circuit. By way of example, arbiter 500 can be used for arbitrating eight requests from eight clients using a shared resource in a mutually exclusive way. Arbiter 500 can grant at most one request at one time. A variation of arbiter 500, labeled as arbiter 550, is shown in FIG. 5B. Arbiter 550 can be a variation of arbiter 500 where an output of inverter 116 is also provided to AND gates 520. This variation may result in faster resetting of the grant issued by the arbiter 550 compared with arbiter 500. The variation where an output of inverter 116 is being provided to a plurality of AND gates can be applicable to other arbiters described herein.

In the embodiment shown in FIG. 5A, arbiter 500 can include a plurality of asynchronous circuits 104, four copies of logic circuit 108, inverters 114, 116, an OR gate 510, a C-element 512, an early propagation tree of OR gates, a plurality of AND gates connected to the grant pins g1 to g8 of arbiter 500, and three copies of logic circuit 308. Four OR gates in arbitration level 1 and two OR gates in arbitration level 2 form the early propagation tree of OR gates to propagate request signals to later arbitration levels. In one embodiment, when all inputs to C-element 512 are high, C-element 512 can output a high or binary one to reset all copies of logic circuits 108, 208, 308. Arbiter 500 can include eight asynchronous circuits 104 for arbitrating eight requests represented by signals sig1 to sig8. When one of the requests is granted, one of the g1 to g8 pins of arbiter 500 will be high and OR gate 510 will output a high signal to the frc pins of asynchronous circuits 104 to reset the asynchronous circuits 104.

In one embodiment, signals sig1 to sig8 received by arbiter 500 can be non-persistent signals (e.g., opposite from well-behaved signals), where these non-persistent signals can be withdrawn at any moment, have hazards (e.g., glitches, high-frequency bursts and jitters), signals produced by analog circuitry (e.g., voltage comparators), or other signals that considered as dirty or not clean, or not purely digital signals. Further, sig1 to sig8 can change their values at any time without any restrictions.

Comparing arbiter 500 to arbiter 300 in FIG. 3, arbiter 500 arbitrates an even number (e.g., eight) of requests similar to arbiter 300 (e.g., four requests). For the even number of requests, arbiter 500 includes N/2=4 copies of logic circuit 108, with N=8, to perform a first level of arbitration ("Level 1" of arbiter 500 in FIG. 5A). As shown in FIG. 5A, after the first level of arbitration, four intermediate grants can be granted or outputted by the four copies of logic circuits 108. These four candidate requests are being provided to AND gates 520. The logic circuits 308 at Level 2 can arbitrate the outputs of OR gates within Level 1 and output the resulting intermediate grants to AND gates 520. Logic circuit 308 in Level 3 of arbiter 500 can arbitrate the outputs of OR gates within Level 2 and output a grant signal to AND gates 520. Note that in arbiter 500 shown in FIG. 5A, logic circuit 308 is being used for arbitrating two requests that were produced by two copies of OR gate. The tree of OR gates shown in FIG. 5A can propagate signals to later arbitration levels while arbitration is occurring concurrently.

Figure 6:
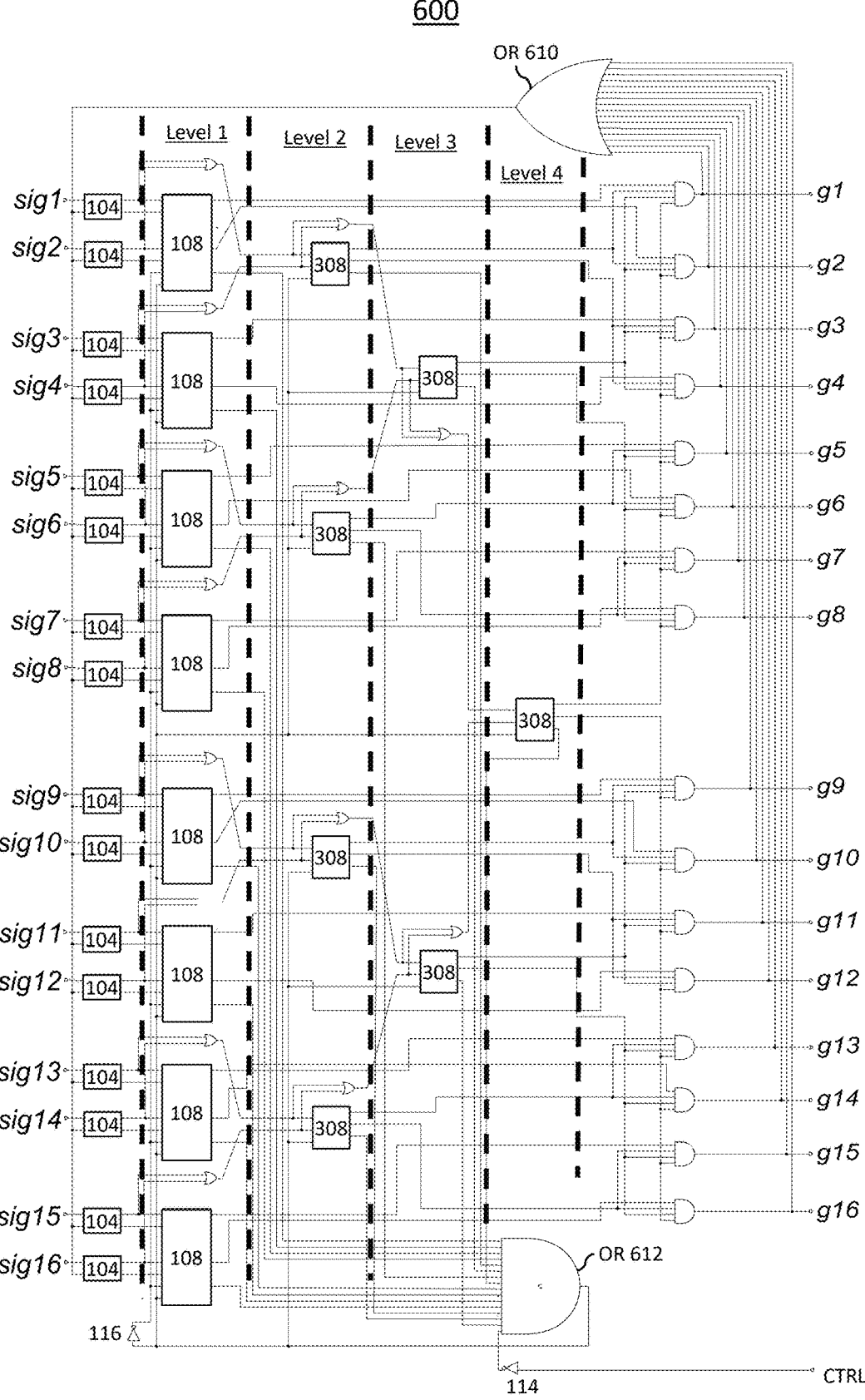
FIG. 6 is a diagram showing another circuit that can implement a scalable arbiter for non-persistent signals in one embodiment.

FIG. 6 is a diagram showing another circuit that can implement a scalable arbiter for non-persistent signals in one embodiment. Description of FIG. 6 can reference components that are shown in FIG. 1 and FIG. 5. A circuit 600 shown in FIG. 6 can be implemented by a semiconductor device. Circuit 600 can be an arbitration circuit, or an arbiter, that can be a reusable asynchronous component and configured to arbitrate between sixteen requests. The sixteen requests sig1 to sig16 being arbitrated by arbiter 600 can be encoded or represented as non-persistent signals, e.g. signals generated by an analog circuit. By way of example, arbiter 600 can be used for arbitrating sixteen requests from sixteen clients using a shared resource in a mutually exclusive way. Arbiter 600 can grant at most one request at one time.

In the embodiment shown in FIG. 6, arbiter 600 can include sixteen copies of asynchronous circuits 104, eight copies of logic circuit 108, inverters 114, 116, an OR gate 610, a C-element 612, an early propagation tree of OR gates, a plurality of AND gates connected to the grant pins g1 to g16 of arbiter 600, and seven copies of logic circuit 308. Eight OR gates in arbitration level 1, four OR gates in arbitration level 2 and two OR gates in arbitration level 3 form the early propagation tree of OR gates to propagate request signals to later arbitration levels. In one embodiment, when all inputs to C-element 612 are high, C-element 612 can output a high or binary one to reset all copies of logic circuits 108, 208, 308. Arbiter 600 can include sixteen asynchronous circuits 104 for arbitrating sixteen requests represented by signals sig1 to sig16. When one of the requests is granted, one of the g1 to g16 pins of arbiter 600 will be high and OR gate 610 will output a high signal to the frc pins of asynchronous circuits 104 to reset the asynchronous circuits 104.

In one embodiment, signals sig1 to sig16 received by arbiter 600 can be non-persistent signals (e.g., opposite from well-behaved signals), where these non-persistent signals can be withdrawn at any moment, have hazards (e.g., glitches, high-frequency bursts and jitters), signals produced by analog circuitry (e.g., voltage comparators), or other signals that considered as dirty or not clean, or not purely digital signals. Further, sig1 to sig16 can change their values at any time without any restrictions.

Comparing arbiter 600 to arbiter 500 in FIG. 5A and arbiter 300 in FIG. 3, arbiter 600 arbitrates an even number (e.g., sixteen) of requests similar to arbiters 300, 500. For the even number of requests, arbiter 600 includes N/2=8 copies of logic circuit 108, with N=16, to perform a first level of arbitration. As shown in FIG. 6, after the first level of arbitration, eight intermediate grants can be outputted by the eight copies of logic circuits 108. These intermediate grants can be provided to a plurality of AND gates before the grant pins of arbiter 600. The logic circuits 308 at Level 2 can arbitrate the eight outputs of the OR gates within Level 1 and output the resulting intermediate grants to the plurality of AND gates before the grant pins of arbiter 600. The logic circuits 308 at Level 3 can arbitrate the outputs of OR gates within Level 2 and output the resulting intermediate grants to the plurality of AND gates before the grant pins of arbiter 600. Logic circuit 308 in Level 4 of arbiter 600 can arbitrate outputs of OR gates within Level 3 and output a grant signal to plurality of AND gates before the grant pins of arbiter 600. The tree of OR gates shown in FIG. 6 can propagate outputs from asynchronous circuits 104 logic circuits in later arbitration levels while arbitration is occurring concurrently.

FIG. 7A to FIG. 7D are diagrams showing embodiments of an asynchronous circuit in a scalable arbiter for non-persistent signals in one embodiment. In an aspect, the signals or voltages at the sig, frc, san or other pins being described herein can be based on a predefined threshold voltage. In one embodiment, the predefined threshold voltage can be VDD/2, where VDD can be a supply voltage being provided to the arbiter including the asynchronous circuit 104. The absolute value of VDD can depend on the silicon process, such as spanning from 5V down to 0.5V in modern technologies. When a signal's voltage is below the predefined threshold voltage, the signal is said to be low, binary zero, or having a voltage level 0. When a signal's voltage is above the predefined threshold voltage, the signal is said to be high, or binary one, or having a voltage level 1.

Figure 7A:
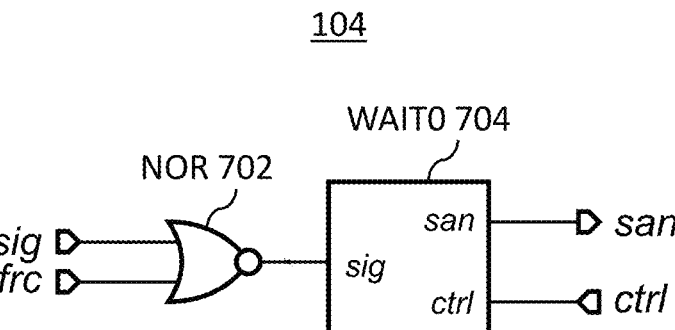
FIG. 7A is a diagram showing an embodiment of an asynchronous circuit in a scalable arbiter for non-persistent signals in one embodiment.

In an embodiment shown in FIG. 7A, asynchronous circuit 104 can include a NOR gate 702 and a circuit 704 ("WAIT0 704"). NOR gate 702 can receive a sig signal representing a request (e.g., sig1 to sig16 as shown in FIG. 1 to FIG. 6) and the frc signal that can be used to force the completion in cases when sig does not arrive for too long or is no longer relevant. The frc pin can be high when one of the grant pins of the arbiter (e.g., arbiters shown in FIG. 1 to FIG. 6) is also high. When frc pin is high, NOR gate 702 outputs a low regardless of the signal event at the sig pin of NOR gate 702. When ctrl=0, asynchronous circuit 104 operates in dormant mode. When ctrl=1, asynchronous circuit 104 operates in waiting mode to wait for the sig pin at NOR gate 702 to be high (e.g., sig=1). If sig=1, then san=1 and stays high even if sig changes, until ctrl is withdrawn (e.g., ctrl=0) and asynchronous circuit 104 returns to dormant mode. If frc=1, regardless of the value of sig, the NOR gate will output logic-1 and the san output will rise. Then ctrl will withdraw after san rises (e.g., san=1) and asynchronous circuit 104 returns to dormant mode to be ready for the next cycle. In one embodiment, if only some requests (not all) of the overall arbiter arrived, a winner can be decided, and the corresponding grant is issued. The OR gate receiving the grant signals (OR 110, 210, 310, etc.) can switch its output high and produce the frc signal to all asynchronous circuits 104 such that they are forced to complete despite some of the sigN requests not having arrived. Hence, san pins of all asynchronous circuits 104 will go high and they can all be safely reset as a part of the overall reset sequence of the arbiter. This operation of frc signal is applicable to various different embodiments of asynchronous circuit 104, such as the embodiments shown in FIG. 7A to FIG. 7D.

When frc is low and sig of NOR gate 702 is low, NOR gate 702 can output a high signal and the san pin of circuit 704 can remain low. When frc is low and sig of NOR gate 702 is high, NOR gate 702 can output a zero to the sig pin of circuit 704. When the sig pin of circuit 704 remains low for the predetermined amount of time, circuit 704 can raise its san pin and output a high signal at the san pin. In an aspect, the sig pin at NOR gate 702 being high for the predetermined amount of time can indicate that a request has been received by NOR gate 702. The sig pin at NOR gate 702 being high for less than the predetermined amount of time can indicate hazards such as short pulses, glitches and jitters, are present and it is not clear whether this should be interpreted as a valid request. Hence it is possible but optional for the san pin to go high in such situations. However, if the sig pin of circuit 704 is high for at least the predetermined amount of time, the san pin will go high. In other words, the embodiment of asynchronous circuit 104 in FIG. 7A can be configured to wait for a high signal at the sig pin.

Figure 7B:
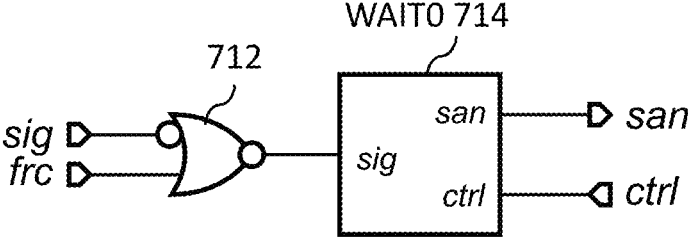
FIG. 7B is a diagram showing another embodiment of an asynchronous circuit in a scalable arbiter for non-persistent signals in one embodiment.

In an embodiment shown in FIG. 7B, asynchronous circuit 104 can include a logic gate 712 and a circuit 714 ("WAIT0 714"). Logic gate 712 can be a NOR gate with one inverted input. Circuit 714 can be identical to circuit 704 shown in FIG. 7A. Logic gate 712 can receive a sig signal representing a request (e.g., sig1 to sig16 as shown in FIG. 1 to FIG. 6) and the frc signal. The frc pin can be high when one of the grant pins of the arbiter (e.g., arbiters shown in FIG. 1 to FIG. 6) is also high. When frc pin is high, logic gate 712 outputs a low regardless of the signal event at the sig pin of logic gate 712. When ctrl=0, asynchronous circuit 104 operates in dormant mode. When ctrl=1, asynchronous circuit 104 operates in waiting mode to wait for the sig pin at NOR gate 702 to be low (e.g., sig=0). If sig=0, then san=1 and stays high even if sig changes, until ctrl is withdrawn (e.g., ctrl=0) and asynchronous circuit 104 returns to dormant mode. If frc=1, regardless of the value of sig, san will rise (e.g. san=1) and stay high until ctrl withdraws and asynchronous circuit 104 returns to dormant mode to be ready for the next cycle.

When frc is low and sig of logic gate 712 is high, logic gate 712 can output a high signal and the san pin of circuit 714 can remain low. When frc is low and sig of NOR gate 702 is also low, logic gate 712 can output a zero to the sig pin of circuit 714. When the sig pin of circuit 714 remains low for the predetermined amount of time, circuit 714 can raise its san pin and output a high signal at the san pin. In an aspect, the sig pin at logic gate 712 being low for the predetermined amount of time can indicate that a request has been received by logic gate 712. The sig pin at logic gate 712 being low for less than the predetermined amount of time can indicate hazards such as short pulses, glitches and jitters, are present and it is not clear whether this should be interpreted as a valid request. Hence it is possible but optional for the san pin to go high in such situations. However, if the sig pin of at logic gate 712 is low for at least the predetermined amount of time, the san pin will go high. In other words, the embodiment of asynchronous circuit 104 in FIG. 7B can be configured to wait for a low signal at the sig pin.

Figure 7C:
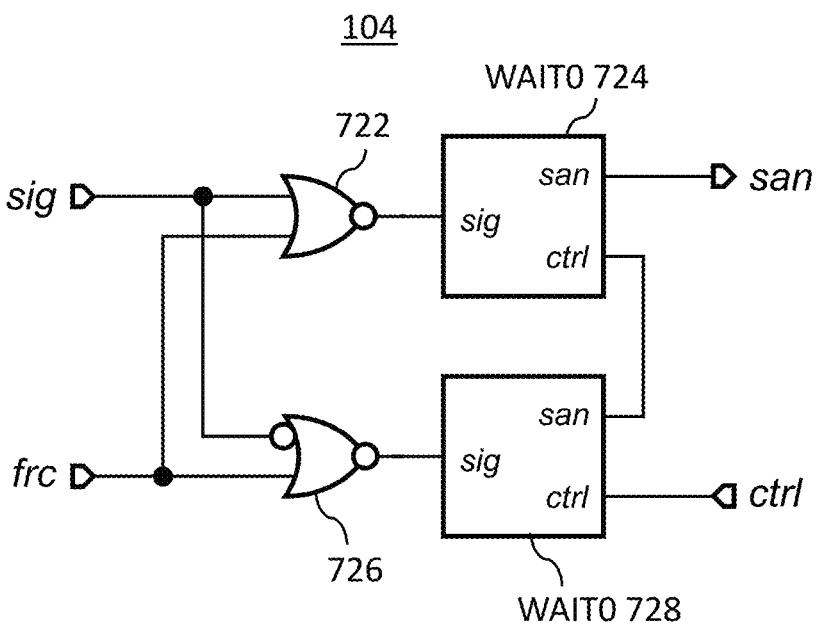
FIG. 7C is a diagram showing another embodiment of an asynchronous circuit in a scalable arbiter for non-persistent signals in one embodiment.

In an embodiment shown in FIG. 7C, asynchronous circuit 104 can include a NOR gate 722, a circuit 724 ("WAIT0 724"), a logic gate 726 and a circuit 728 ("WAIT0 728"). NOR gate 722 can receive a sig signal representing a request (e.g., sig1 to sig16 as shown in FIG. 1 to FIG. 6) and the frc signal. Logic gate 726 can also receive the sig signal representing the request and the frc signal. The combination of NOR gate 722 and circuit 724 can be identical to the combination of NOR gate 702 and circuit 704 in FIG. 7A. Thus, the combination of NOR gate 722 and circuit 724 can wait for the logic-1 value on the sig pin of asynchronous circuit 104 and raise its san pin in response. Logic gate 726 can be identical to logic gate 712 in FIG. 7B. The combination of logic gate 726 and circuit 728 can be identical to the combination of logic gate 712 and circuit 714 in FIG. 7B. Thus, the combination of logic gate 726 and circuit 728 can wait for the sig pin of asynchronous circuit 104 to be low and raise its san pin to high in response.

In the embodiment shown in FIG. 7C, the ctrl pin of circuit 724 can be controlled by the san pin of circuit 728. When the san pin of circuit 728 is low, the ctrl pin of circuit 724 is also low thus circuit 724 operates in dormant mode. When the san pin of circuit 728 is high, the ctrl pin of circuit 724 is also high thus circuit 724 operates in waiting mode. By way of example, when the sig pin of asynchronous circuit 104 is zero, the san pin of circuit 728 can be high and trigger waiting mode of circuit 724. As the sig pin of asynchronous circuit 104 changes from zero to one under circuit 724 waiting mode, the sig pin of circuit 724 will be low and trigger the san pin of circuit 724 to be high. When circuit 104 is in the waiting mode (i.e. ctrl=1) and its frc pin is high, logic gates 722 and 726 output logic-0 regardless of the signal event at the sig pin. This causes circuit 728 to raise its san output thereby bringing circuit 724 from dormant mode to waiting mode. In turn, circuit 724 will raise its san output. Hence, if frc=1, regardless of the value of sig, san will rise (e.g. san=1) and stay high until ctrl withdraws (e.g. ctrl=0) and asynchronous circuit 104 returns to dormant mode to be ready for the next cycle. Thus, the embodiment of asynchronous circuit 104 shown in FIG. 7C can be configured to wait for a rising edge (e.g., from low to high) at the sig pin of asynchronous circuit 104.

Figure 7D:
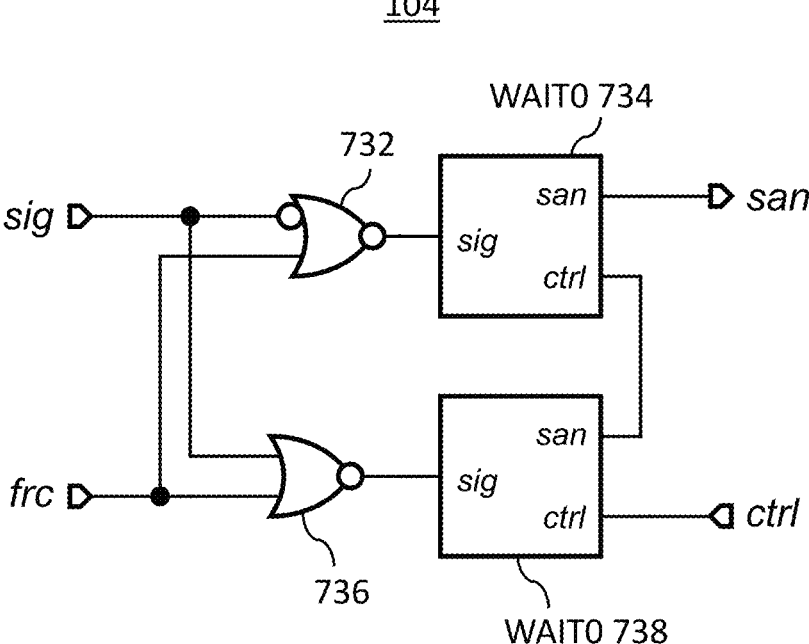
FIG. 7D is a diagram showing another embodiment of an asynchronous circuit in a scalable arbiter for non-persistent signals in one embodiment.

In an embodiment shown in FIG. 7D, asynchronous circuit 104 can include a logic gate 732, a circuit 734 ("WAIT0 734"), a NOR gate 736 and a circuit 738 ("WAIT0 738"). Logic gate 732 can receive a sig signal representing a request (e.g., sig1 to sig16 as shown in FIG. 1 to FIG. 6) and the frc signal. NOR gate 736 can also receive the sig signal representing the request and the frc signal. Logic gate 732 can be identical to logic gate 712 in FIG. 7B. The combination of logic gate 732 and circuit 734 can be identical to the combination of NOR gate 712 and circuit 714 in FIG. 7B. Thus, the combination of logic gate 732 and circuit 734 can wait for the sig pin of asynchronous circuit 104 to be low and raise its san pin to high in response. The combination of NOR gate 736 and circuit 738 can be identical to the combination of NOR gate 702 and circuit 704 in FIG. 7A. Thus, the combination of NOR gate 736 and circuit 738 can wait for the sig pin of asynchronous circuit 104 to be high and raise its san pin to high in response.

In the embodiment shown in FIG. 7D, the ctrl pin of circuit 734 can be controlled by the san pin of circuit 738. When the san pin of circuit 738 is low, the ctrl pin of circuit 734 is also low thus circuit 734 operates in dormant mode. When the san pin of circuit 738 is high, the ctrl pin of circuit 734 is also high thus circuit 734 operates in waiting mode. By way of example, when the sig pin of asynchronous circuit 104 is high, the san pin of circuit 738 can be high and trigger waiting mode of circuit 734. As the sig pin of asynchronous circuit 104 changes from high to low under circuit 734 waiting mode, the sig pin of circuit 734 will be low and trigger the san pin of circuit 734 to be high. When circuit 104 is in the waiting mode (i.e. ctrl=1) and its frc pin is high, logic gates 732 and 736 output logic-0 regardless of the signal event at the sig pin. This causes circuit 738 to raise its san output thereby bringing circuit 734 from dormant mode to waiting mode. In turn, circuit 734 will raise its san output. Hence, if frc=1, regardless of the value of sig, san will rise (e.g. san=1) and stay high until ctrl withdraws (e.g. ctrl=0) and asynchronous circuit 104 returns to dormant mode to be ready for the next cycle. Thus, the embodiment of asynchronous circuit 104 shown in FIG. 7D can be configured to wait for a falling edge (e.g., from high to low) at the sig pin of asynchronous circuit 104.

Figure 8:
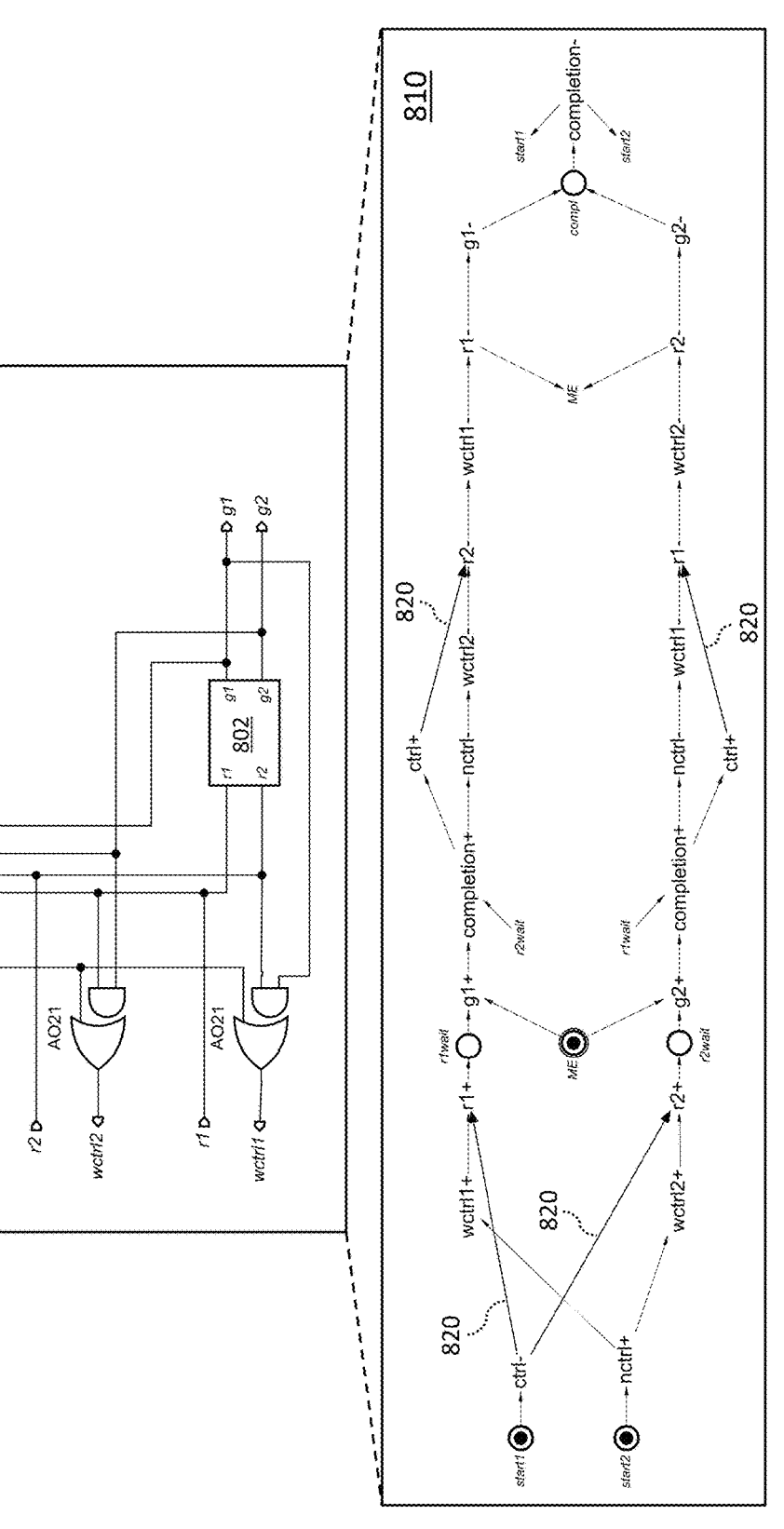
FIG. 8 is a diagram showing an embodiment of a first logic circuit that can be implemented in a scalable arbiter for non-persistent signals in one embodiment.

FIG. 8 is a diagram showing an embodiment of a first logic circuit (e.g., logic circuit 108) that can be implemented in a scalable arbiter for non-persistent signals in one embodiment. Description of FIG. 8 can reference components shown in FIG. 1 to FIG. 7D. An example embodiment of logic circuit 108 is shown in FIG. 8. As shown in FIG. 8, logic circuit 108 can include a MUTEX circuit 802 and a plurality of logic gates such as a 2-2-2 OR-AND gate (AO222), and two 2-1 AND-OR gates (AO21). The r1 and r2 pins of logic circuit 108 can receive sanitized signals from two copies of asynchronous circuits 104.

MUTEX circuit 802 can arbitrate the sanitized signals received at the r1 and r2 pins. In an aspect, if the two requests received at pins r1, r2 occur at substantially the same time, MUTEX circuit 802 can enter a metastable state. Under the metastable state, MUTEX circuit 802 can keep both grant pins g1, g2 low until the metastability is resolved, and then raise either g1 or g2 but not both. If the signal at pin r1 rises (e.g., transition from low to high) before the signal at pin r2 rises, then MUTEX circuit 802 can raise the grant signal at pin g1 (e.g., output high) and pin g2 is held at low. If the signal at pin r2 rises before the signal at pin r1 rises, then MUTEX circuit 802 can raise the signal at pin g2 and g1 is held at low.

A signal transition graph (STG) 810 that depicts signal transitions of the example implementation of logic circuit 108 of FIG. 8 is also shown in FIG. 8. In STG 810 (and other STGs described herein), a plus sign "+" can indicate a rising transition from low to high and a minus sign "−" can indicate a falling transition from high to low.

Referring to FIG. 1, inverter 116 can invert the output of the C-element 112 and the output of inverter 116 can be provided to the nctrl pin of logic circuit 108. In one embodiment, the input/output slews on inverter 116 can be defined such that inverter 116 has a negative delay that can still be tolerated up to a target tolerance. The edges 820 in STG 810 are indicative of the timing assumptions resulting from the defined input/output slews.

Referring to STG 810, when the ctrl pin of logic circuit 108 set to low (ctrl-) and the nctrl pin is high (nctrl+), logic circuit 108 can arbitrate the r1 and r2 inputs. The arbitration ensures that g1 and g2 are mutually exclusive (modelled by the ME node) such that only one of the g1+ or g2+ path proceeds in the STG 810. For either path, the completion pin (comp pin) can be set to high (completion+) to indicate the arrival of both r1 and r2 and a completed arbitration. After the completion pin is set to high, the ctrl pin can be set to high (ctrl+) and the nctrl pin can be set to low (nctrl−). When the nctrl pin is low, the wctrl pin corresponding to the input that was not issued a grant will be set to low. For example, in STG 810, along the g1+ path, the wctrl2 pin corresponding to the r2 pin is set to low in response to nctrl being low (wctrl2−). After wctrl2 is set to low, the input pin r2 is set to low as well (r2−). Note that the ctrl+ after completion+ has the delay indicated by edge 820 (resulting from the defined input/output slew of inverter 116) to provide ample time for the logic components in logic circuit 108 to set the r2 pin low. When the r2 pin is low, then the wctrl pin of the granted request, such as wctrl1 pin is set to low (wctrl−) as well in order to set the r1 pin low (r1−). Once both r1 and r2 pins are low, the issued grant, either g1 or g2, can also be set to low (g1− or g2−) such that logic circuit 108 is reset to perform the next arbitration.

Figure 9:
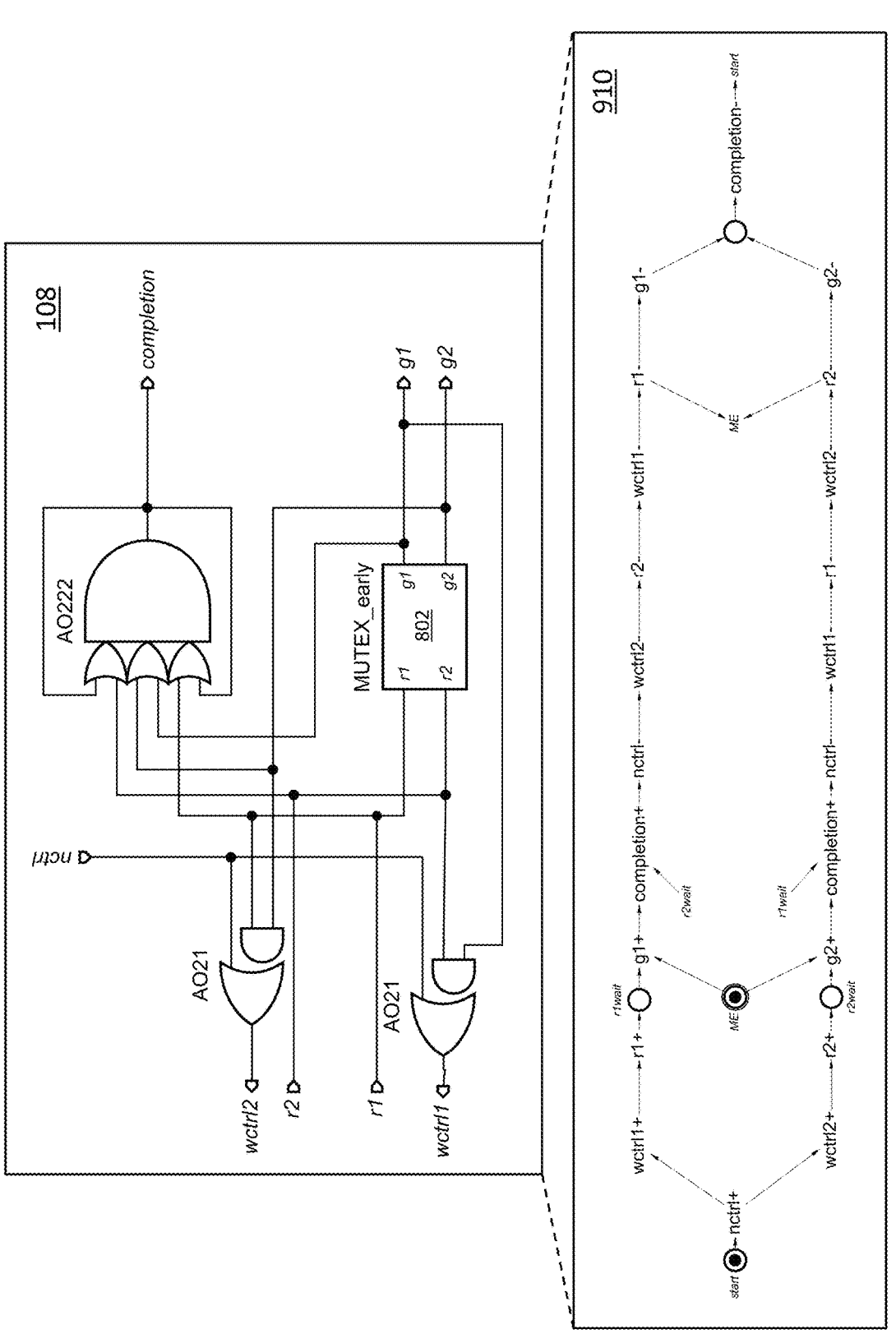
FIG. 9 is a diagram showing another embodiment of the first logic circuit that can be implemented in a scalable arbiter for non-persistent signals in one embodiment.

FIG. 9 is a diagram showing another embodiment of the first logic circuit (e.g., logic circuit 108) that can be implemented in a scalable arbiter for non-persistent signals in one embodiment. Description of FIG. 9 can reference components shown in FIG. 1 to FIG. 8. An example embodiment of logic circuit 108 is shown in FIG. 9. As shown in FIG. 9, logic circuit 108 can include MUTEX circuit 802 and a plurality of logic gates such as a 2-2-2 OR-AND gate (AO222), and two 2-1 AND-OR gates (AO21). The r1 and r2 pins of logic circuit 108 can receive sanitized signals from two copies of asynchronous circuits 104. Compared to the embodiment shown in FIG. 8, the embodiment of logic circuit 108 in FIG. 9 does not use the ctrl input and the completion pin has a feedback loop that feeds back to the inputs of the AO222 gate. A signal transition graph (STG) 910 that depicts signal transitions of the example implementation of logic circuit 108 of FIG. 9 is also shown in FIG. 9.

Referring to STG 910, when the nctrl pin of logic circuit 108 is set to high (nctrl+), the wctrl1 and wctrl2 pins can also be set to high (wctrl1+ and wctrl2+) to wait for requests at the r1 and r2 pins. When at least one request is received at the r1 and r2 pins (r1+ and/or r2+), logic circuit 108 can arbitrate the r1 and r2 inputs. The arbitration ensures that g1 and g2 are mutually exclusive (modelled by the ME node) such that only one of the g1+ or g2+ path proceeds in the STG 910. For either path, the completion pin (comp pin) can be set to high (completion+) to indicate a completed arbitration. After the completion pin is set to high, the nctrl pin can be set to low (nctrl-). When the nctrl pin is low, the wctrl pin corresponding to the input that was not issued a grant will be set to low. After the wctrl pins are set to low, the corresponding input pins r1, r2 are set to low, and the issued grant (g1 or g2) and completion signal are set to low as well such that logic circuit 108 is reset to perform the next arbitration.

Figure 10:
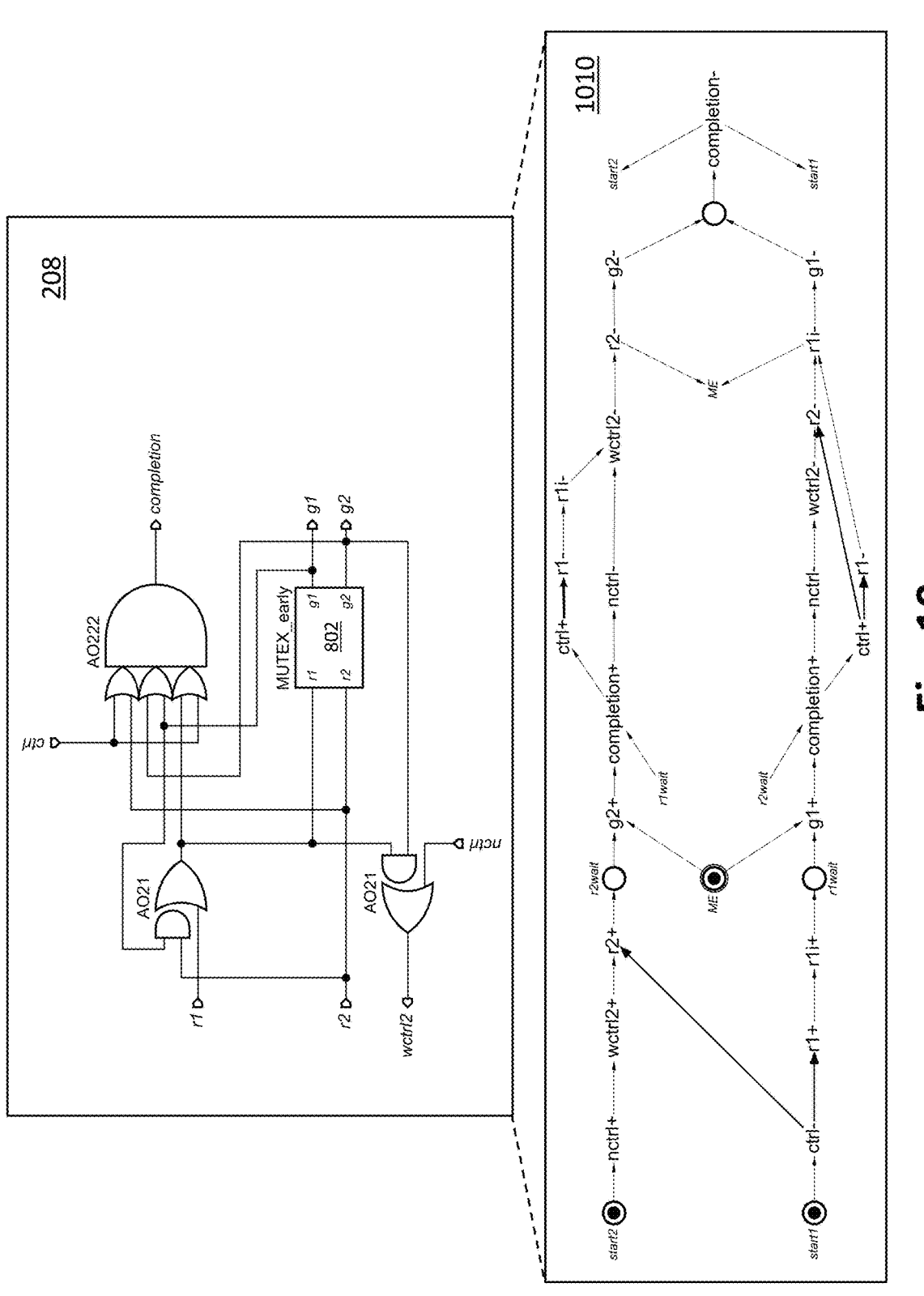
FIG. 10 is a diagram showing an embodiment of a second logic circuit that can be implemented in a scalable arbiter for non-persistent signals in one embodiment.

FIG. 10 is a diagram showing an embodiment of a second logic circuit (e.g., logic circuit 208) that can be implemented in a scalable arbiter for non-persistent signals in one embodiment. Description of FIG. 10 can reference components shown in FIG. 1 to FIG. 9. An example embodiment of logic circuit 208 is shown in FIG. 10. As shown in FIG. 10, logic circuit 208 can include MUTEX circuit 802 and a plurality of logic gates such as a 2-2-2 OR-AND gate (AO222), and two 2-1 AND-OR gates (AO21). The r1 pin of logic circuit 208 can receive a sanitized signal from an OR gate and the r2 pin of logic circuit 208 can receive another sanitized signal from a copy of asynchronous circuit 104 (see FIG. 2 and FIG. 4). A signal transition graph (STG) 1010 that depicts signal transitions of the example implementation of logic circuit 208 of FIG. 10 is also shown in FIG. 10.

Referring to STG 1010, the r1 pin of logic circuit 208 can receive a request from an OR gate when the ctrl pin is set to low (ctrl−). In response, an internal request r1$i$+ is produced. The r2 pin of logic circuit 208 can receive a request from a copy of asynchronous circuit 104 when the wctrl2 pin is set to high (wctrl2+) after the nctrl pin is set to high (nctrl+). When at least one request is received at the r1 and r2 pins (r1+ and/or r2+), logic circuit 208 can arbitrate the signals at the r1 and r2 pins. The arbitration ensures that g1 and g2 are mutually exclusive (ME node) such that only one of the g1+ or g2+ path proceeds in the STG 1010. For either path, the completion pin (comp pin) can be set to high (completion+) to indicate the arrival of both r1 and r2 and a completed arbitration. After the completion pin is set to high, the ctrl pin can be set to high (ctrl+) and the nctrl pin can be set to low (nctrl−). This triggers a reset sequence that sets signals wctrl2, r1, r1$i$, r2, the issued grant (either g1 or g2), and completion low such that logic circuit 208 is reset to perform the next arbitration.

Figure 11:
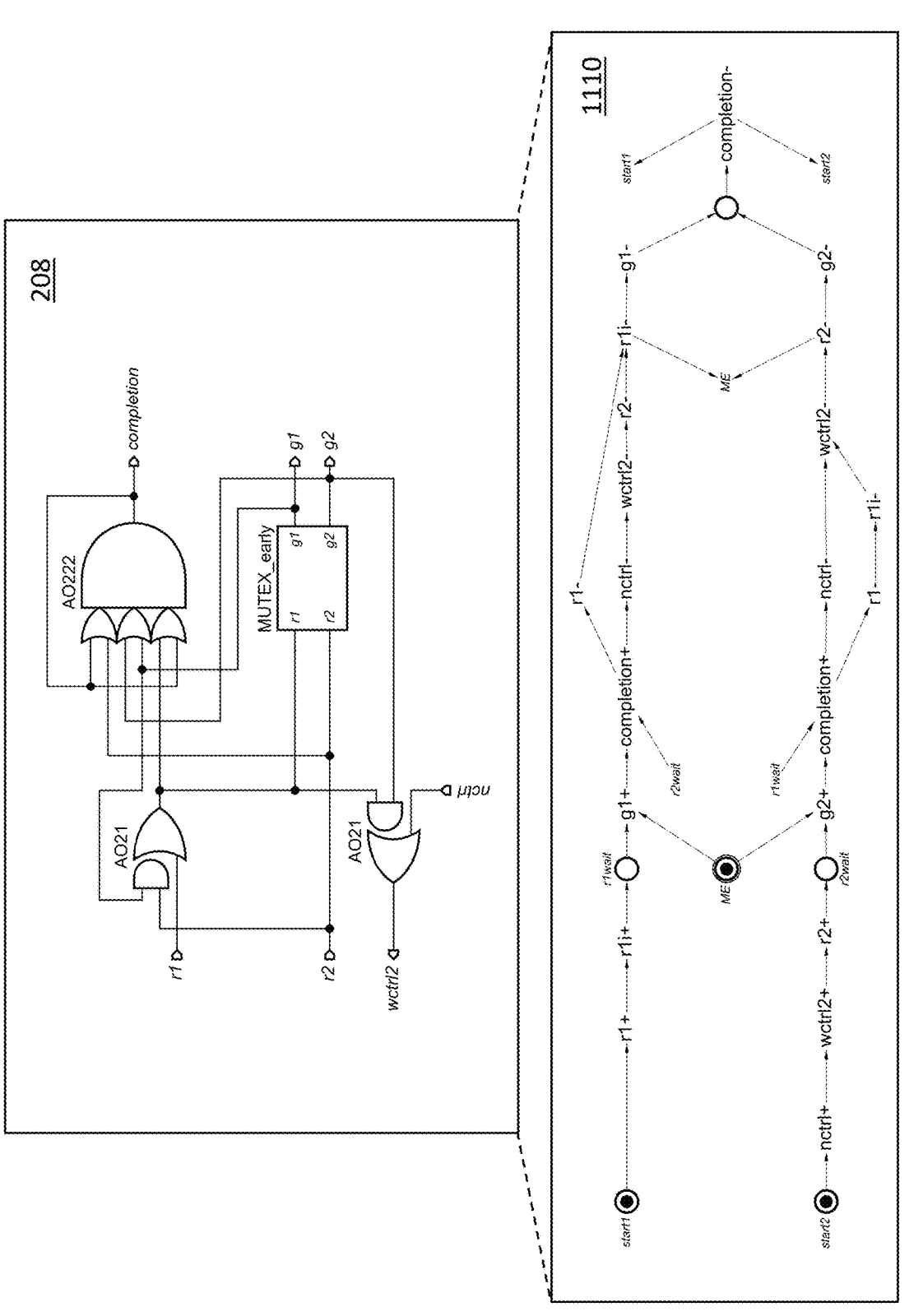
FIG. 11 is a diagram showing another embodiment of the second logic circuit that can be implemented in a scalable arbiter for non-persistent signals in one embodiment.

FIG. 11 is a diagram showing another embodiment of the second logic circuit (e.g., logic circuit 208) that can be implemented in a scalable arbiter for non-persistent signals in one embodiment. Description of FIG. 11 can reference components shown in FIG. 1 to FIG. 10. An example embodiment of logic circuit 208 is shown in FIG. 11. As shown in FIG. 11, logic circuit 208 can include MUTEX circuit 802 and a plurality of logic gates such as a 2-2-2 OR-AND gate (AO222), and two 2-1 AND-OR gates (AO21). The r1 pin of logic circuit 208 can receive a sanitized signal from an OR gate and the r2 pin of logic circuit 208 can receive another sanitized signal from a copy of asynchronous circuit 104 (see FIG. 2 and FIG. 4). Compared to the embodiment shown in FIG. 10, the embodiment of logic circuit 208 in FIG. 11 does not use the ctrl input and the completion pin has a feedback loop that feeds back to the inputs of the AO222 gate. A signal transition graph (STG) 1110 that depicts signal transitions of the example implementation of logic circuit 208 of FIG. 11 is also shown in FIG. 11.

Referring to STG 1110, the r1 pin of logic circuit 208 can receive a request from an OR gate. In response, an internal request r1$i$+ is produced. The r2 pin of logic circuit 208 can receive a request from a copy of asynchronous circuit 104 when the wctrl2 pin is set to high (wctrl2+) after the nctrl pin is set to high (nctrl+). When requests are received at the r1 and r2 pins (r1+ and r2+), logic circuit 208 can arbitrate the signals at the r1 and r2 pins. The arbitration ensures that g1 and g2 are mutually exclusive (ME node) such that only one of the g1+ or g2+ path proceeds in the STG 1110. For either path, the completion pin (comp pin) can be set to high (completion+) to indicate the arrival of both r1 and r2 and a completed arbitration. After the completion pin is set to high, a reset sequence is performed, that sets signals nctrl, wctrl2, r1, r1$i$, r2, the issued grant (either g1 or g2), and completion low such that logic circuit 208 is reset to perform the next arbitration.

Figure 12:
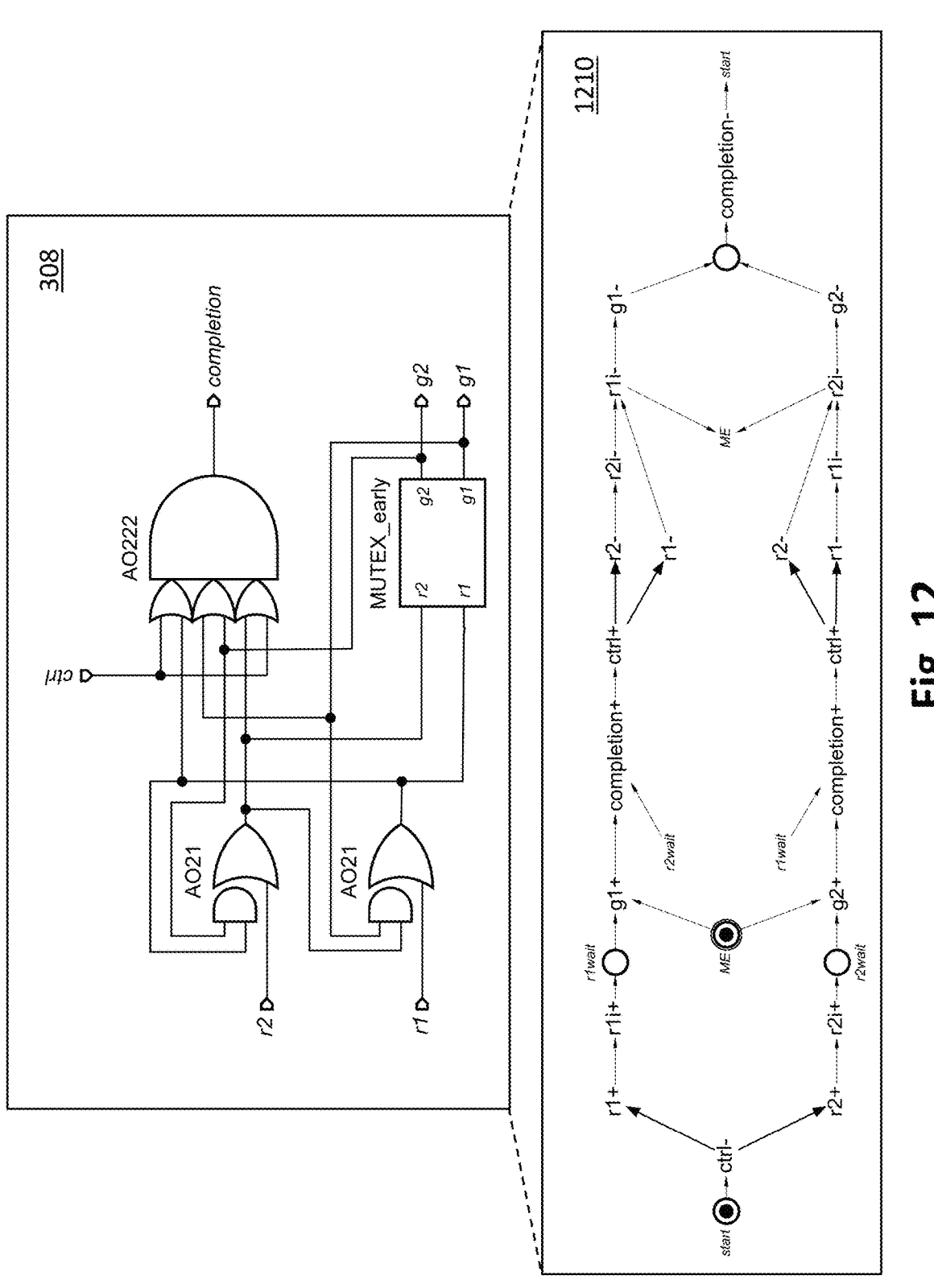
FIG. 12 is a diagram showing an embodiment of a third logic circuit that can be implemented in a scalable arbiter for non-persistent signals in one embodiment.

FIG. 12 is a diagram showing an embodiment of a third logic circuit (e.g., logic circuit 308) that can be implemented in a scalable arbiter for non-persistent signals in one embodiment. Description of FIG. 12 can reference components shown in FIG. 1 to FIG. 11. An example embodiment of logic circuit 308 is shown in FIG. 12. As shown in FIG. 12, logic circuit 308 can include MUTEX circuit 802 and a plurality of logic gates such as a 2-2-2 OR-AND gate (AO222), and two 2-1 AND-OR gates (AO21). Each one of the r1 and r2 pins of logic circuit 208 can receive a sanitized signal from an OR gate. A signal transition graph (STG) 1210 that depicts signal transitions of the example implementation of logic circuit 308 of FIG. 12 is also shown in FIG. 12.

Referring to STG 1210, when the ctrl pin is low (ctrl–), each one of the r1 and r2 pins of logic circuit 308 can receive a request from a copy of logic circuit 108. When at least one request is received at the r1 and r2 pins (r1+ and/or r2+), logic circuit 308 can arbitrate the signals at the r1 and r2 pins. The arbitration ensures that g1 and g2 are mutually exclusive (ME node) such that either one of the g1+ or g2+ path proceeds in the STG 1210. For either path, the completion pin (comp pin) can be set to high (completion+) to indicate the arrival of both r1 and r2 and a completed arbitration. After the completion pin is set to high, a reset sequence is performed, that sets signals nctrl, wctrl2, r1, r1$i$, r2, the issued grant (either g1 or g2), and completion low such that logic circuit 308 is reset to perform the next arbitration.

Figure 13:
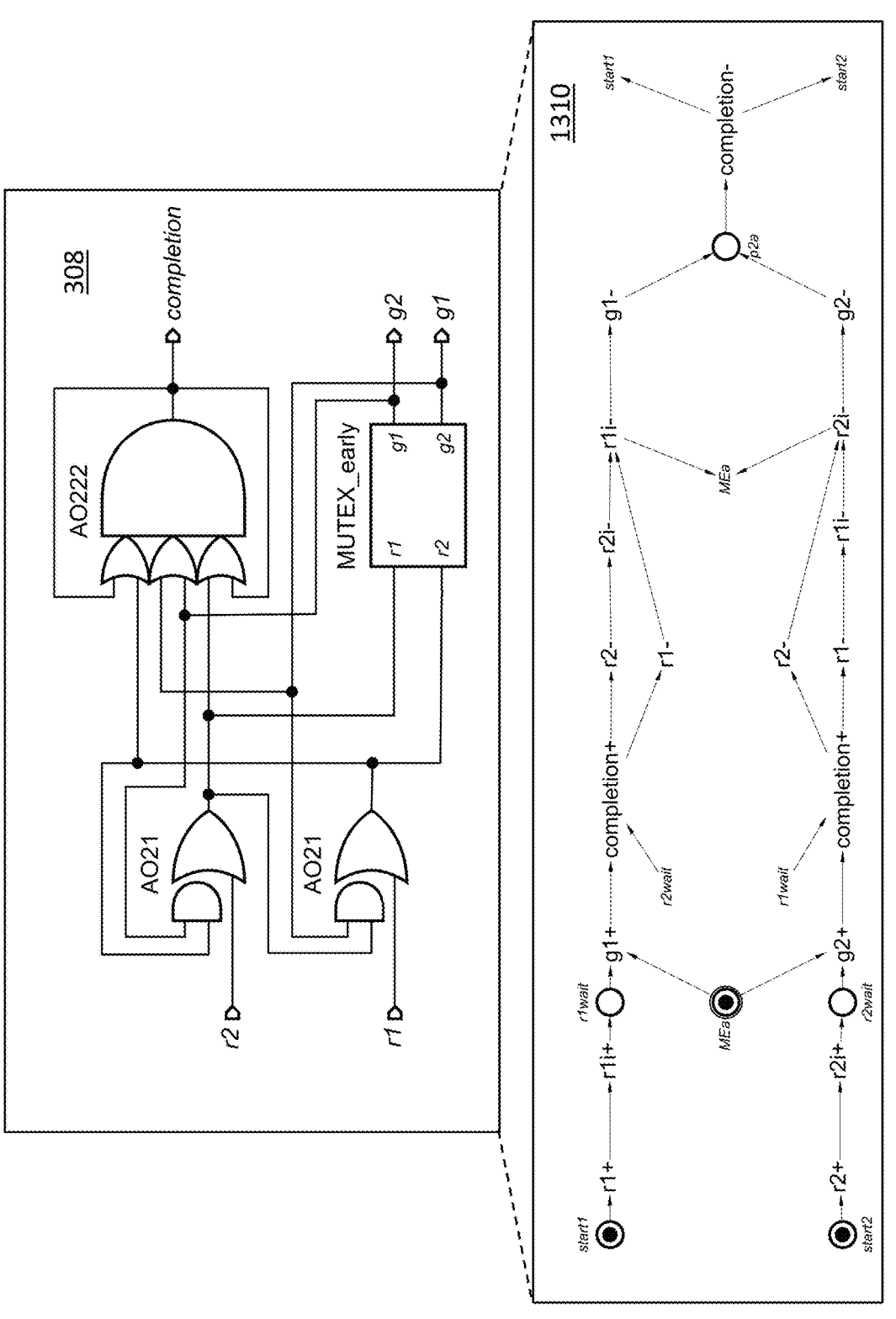
FIG. 13 is a diagram showing another embodiment of the third logic circuit that can be implemented in a scalable arbiter for non-persistent signals in one embodiment.

FIG. 13 is a diagram showing another embodiment of the third logic circuit (e.g., logic circuit 308) that can be implemented in a scalable arbiter for non-persistent signals in one embodiment. Description of FIG. 13 can reference components shown in FIG. 1 to FIG. 12. An example embodiment of logic circuit 308 is shown in FIG. 13. As shown in FIG. 13, logic circuit 308 can include MUTEX circuit 802 and a plurality of logic gates such as a 2-2-2 OR-AND gate (AO222), and two 2-1 AND-OR gates (AO21). Each one of the r1 and r2 pins of logic circuit 308 can receive a sanitized signal from an OR gate. Compared to the embodiment shown in FIG. 12, the embodiment of logic circuit 308 in FIG. 13 does not use the ctrl input and the completion pin has a feedback loop that feeds back to the inputs of the AO222 gate. A signal transition graph (STG) 1310 that depicts signal transitions of the example implementation of logic circuit 308 of FIG. 13 is also shown in FIG. 13.

Referring to STG 1310, each one of the r1 and r2 pins of logic circuit 308 can receive a request from a copy of an OR gate. When at least one request is received at the r1 and r2 pins (r1+ and/or r2+), logic circuit 308 can arbitrate the signals at the r1 and r2 pins. The arbitration ensures that g1 and g2 are mutually exclusive (ME node) such that either one of the g1+ or g2+ path proceeds in the STG 1210. For either path, the completion pin (comp pin) can be set to high (completion+) to indicate the arrival of both r1 and r2 and a completed arbitration. After the completion pin is set to high, a reset sequence is performed, that sets signals r1, r1$i$, r2, r2$i$, the issued grant (either g1 or g2), and completion low such that logic circuit 308 is reset to perform the next arbitration.

Figure 14:
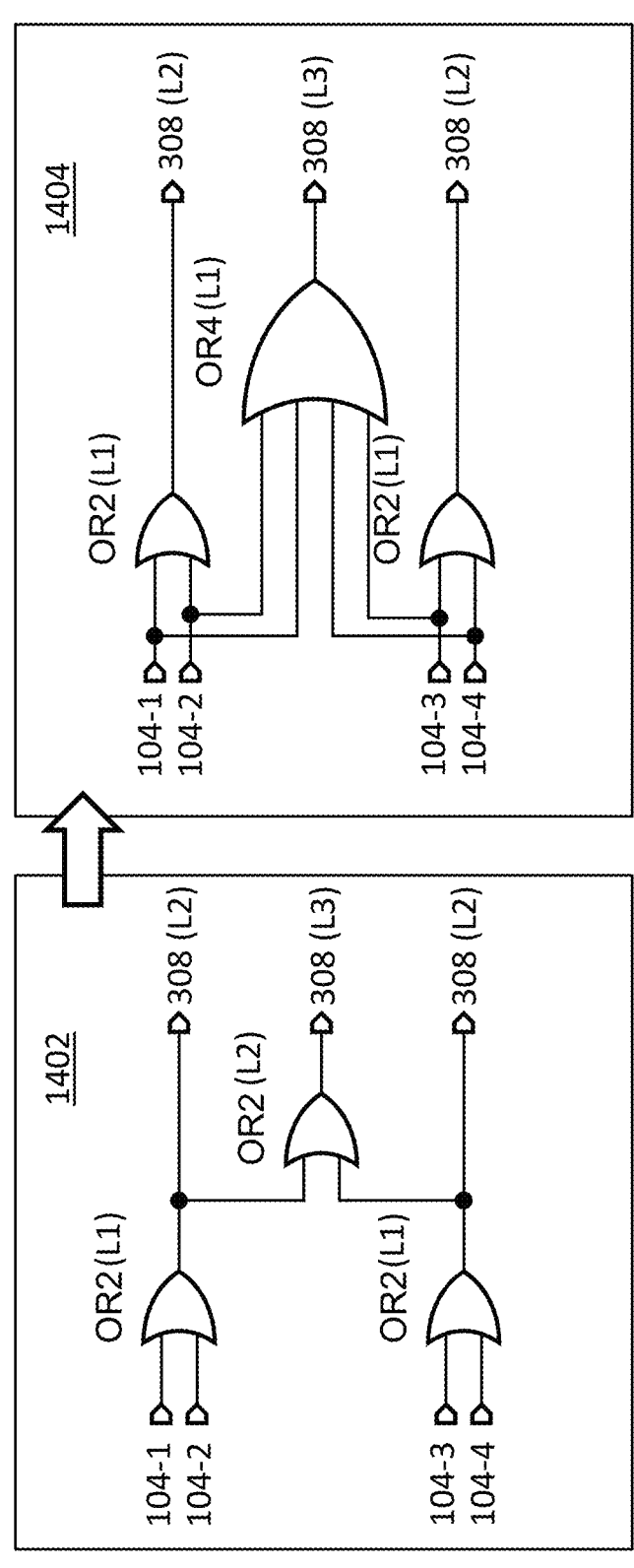
FIG. 14 is a diagram showing an optimization scheme for a scalable arbiter for non-persistent signals in one embodiment.

FIG. 14 is a diagram showing an optimization scheme for a scalable arbiter for non-persistent signals in one embodiment. Description of FIG. 14 can reference components shown in FIG. 1 to FIG. 13. In an example embodiment shown in FIG. 14, when an arbiter has more than four inputs (N>4), there can be two or more levels of OR gates being used for early propagation of signals in the arbiters, as shown in FIG. 4 to FIG. 6. In an example shown in FIG. 14, the two or more levels of OR gates can be arranged in different configurations to optimize performance of the arbiters. Example configurations 1402 and 1404 are shown in FIG. 14.

Configuration 1402 depicts an arrangement of 2-to-1 OR gates (OR2) spanning two levels of arbitration, e.g. two OR2 gates in level 1 (L1) and one OR2 gate in level 2 (L2). Configuration 1402 can be implemented in arbiters having more than four inputs such as the arbiters shown in FIG. 4 to FIG. 6. In configuration 1402, the logic operations may be performed by levels sequentially, such as at least one of the OR2 gates at L1 needs to complete its operations first, then the OR2 gate at L2 complete their operations, then at last at level 3 (L3) the logic circuit 308 at L3 can use the result from the OR2 gate in L2. Level 1 (L1) can be referred to as an initial level, and level 2 (L2) and subsequent levels can be referred to as additional levels.

To optimize an operation speed of the arbiters, configuration 1404 can be used in place of configuration 1402. Configuration 1404 depicts an arrangement of OR2 gates at L1 and a 4-to-1 OR gate (OR4) also at L1. In configuration 1404, the two OR2 gates and the OR4 gate at L1 can complete their operations concurrently at L1. The output of the OR2 gates can be provided to the two logic circuits 308 at L2 and the output of the OR4 gate can be provided to the logic circuit 308 at L3. Therefore, the logic circuits 308 in L3 can receive its requests earlier, which improves the overall latency of the arbiter. As will be clear to those of ordinary skills, this optimization can be used at any level of arbitration, and can span more than two levels of arbitration.

Figure 15:
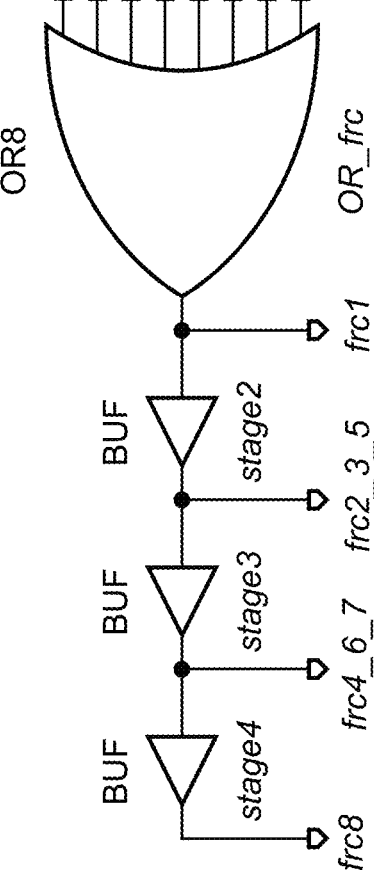
FIG. 15 is a diagram showing another optimization scheme for a scalable arbiter for non-persistent signals in one embodiment.

FIG. 15 is a diagram showing another optimization scheme for a scalable arbiter for non-persistent signals in one embodiment. Description of FIG. 15 can reference components shown in FIG. 1 to FIG. 14. The frc inputs of asynchronous circuits 104 can be triggered simultaneously by the OR gate that receives the grant pins feedback (see OR gates 110, 210, 310, 410, 510, 610 in FIG. 1 to FIG. 6). In an aspect, the simultaneous triggering of the frc inputs can cause near-simultaneous requests to the MUTEX circuits inside the logic circuits 108, 208, 308, which in turn may cause relatively long metastability resolution times that may be undesirable. To alleviate this concern, the output of the OR gate towards the frc pins of asynchronous circuits 104 can be produced in several stages by applying delays between stages.

In an embodiment shown in FIG. 15, a plurality of buffers or delays (BUF) can be added between the output of the OR gate (OR8, for N=8) and at least one the frc pins of asynchronous circuits 104 to delay at least one of the frc signals to the frc pins. By way of example, a frc signal labeled as frc1 can be outputted to an asynchronous circuit 104-1. A frc signal labeled as frc2_3_5 can be outputted to asynchronous circuit 104-2, 104-3, 104-5. A frc signal labeled as frc4_6_7 can be outputted to asynchronous circuit 104-4, 104-6, 104-7. A frc signal labeled as frc8 can be outputted to an asynchronous circuit 104-8. With the delays applied, the MUTEX circuits inside the logic circuits 108, 208, 308, may not be exposed to near-simultaneous requests caused by the frc signals in circuits 104.

In one embodiment, the allocation of different frc signals to one or more different asynchronous circuits 104 can begin at a first step with a sequence "1". Then on each step, a new sequence is appended by incrementing all numbers in the current sequence, until there are N or more elements. By way of example, the first step sequence is "1", the second step sequence is "12" since the first step sequence (current sequence) is a "1" and an increment of "1" is "2", so the incremented number of "2" is appended to "1" to result in the second step sequence "12".

The third step sequence is "1223" since the second step sequence (current sequence) is a "12" and an increment of each number in "12" is "23", so the incremented numbers of "23" is appended to "12" to result in the third step sequence "1223". The fourth step sequence is "12232334" since the third step sequence (current sequence) is a "1223" and an increment of each number in "1223" is "2334", so the incremented numbers of "2334" is appended to "1223" to result in the fourth step sequence "12232334". At the fourth step, there are eight elements and hence the fourth step sequence can be used for assigning the frc signals to different stages. In the example shown in FIG. 5, frc1 is assigned to the first stage because the first number in the sequence "12232334" is "1" (note there is one instance of "1" in the sequence). The signal frc2_3_5 is assigned to the second stage because the second, third and fifth numbers in the sequence "12232334" are "2" (note there are three instances of "2" in the sequence). The signal frc4_6_7 is assigned to the third stage because the fourth, sixth and seventh numbers in the sequence "12232334" are "3" (note there are three instances of "3" in the sequence). The signal frc8 is assigned to the fourth stage because the eighth number in the sequence "12232334" is "4" (note there is one instance of "1" in the sequence).

Figure 16A:
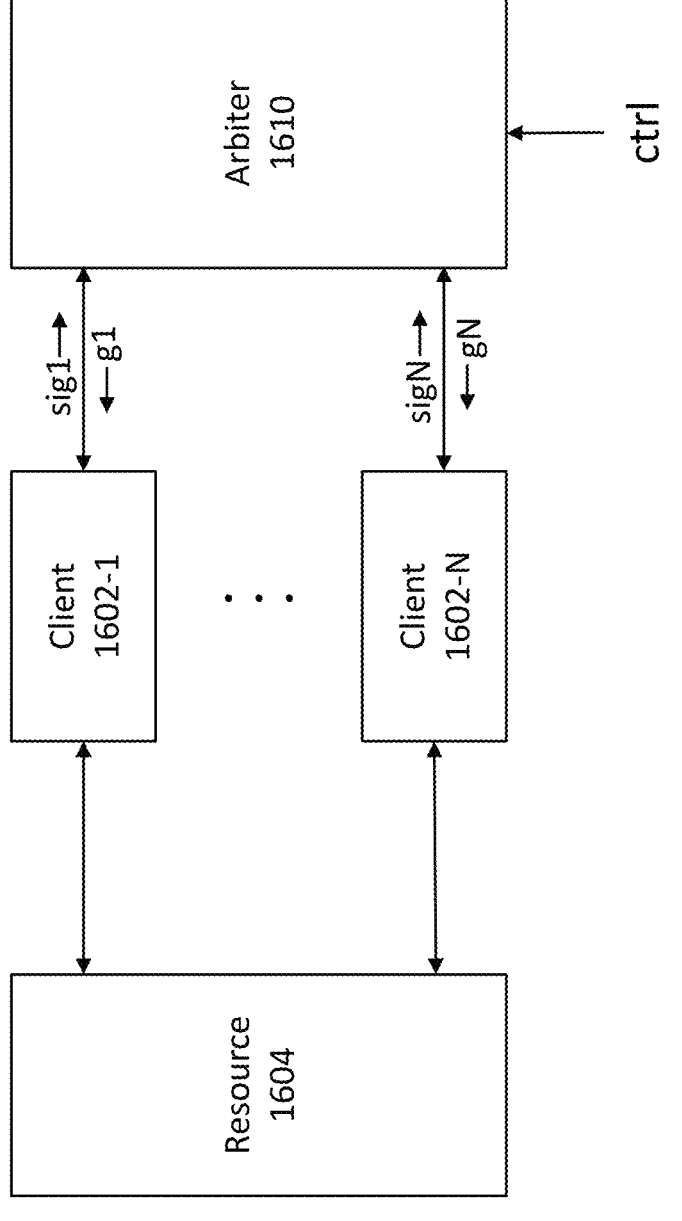
FIG. 16A is a diagram showing a system that uses a scalable arbiter for non-persistent signals in one embodiment.
Figure 16B:
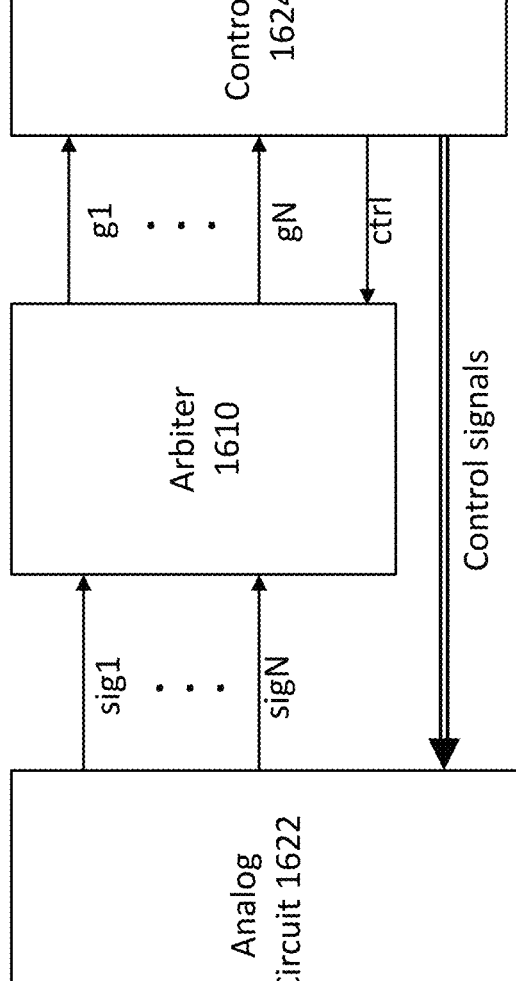
FIG. 16B is a diagram showing a system that uses a scalable arbiter for non-persistent signals in one embodiment.

FIG. 16A and FIG. 16B are diagrams showing example systems that can utilize a scalable arbiter for non-persistent signals in one embodiment. Description of FIG. 16A and FIG. 16B can reference components shown in FIG. 1 to FIG. 15. Systems 1600 and 1620 shown in FIG. 16A and FIG. 16B, respectively, can be example systems or applications that can utilize an arbiter 1610 configured to arbitrate non-persistent signals. Arbiter 1610 can be, for example, any one of arbiters described above. Arbiter 1610 can be configured to receive N requests for a resource 1604, where the N requests can be represented by N non-persistent signals denoted as sig1, . . . , sigN, where N can be greater than or equal to two. A plurality of clients 1602-1, . . . 1602-N, or N client devices, can send the N non-persistent signals sig1, . . . ,sigN to arbiter 510. Arbiter 1610 can arbitrate among the N non-persistent signals sig1, . . . , sigN and issue at most one grant at a time as one of grant signals g1, . . . gN. In another embodiment, systems 1600, 1620 can be implemented in various asynchronous circuits, power management integrated circuits (ICs), asynchronous controllers, AC-DC converters, near field communication (NFC) rectifiers, single inductor multiple output converter, or other types of asynchronous systems (e.g., system 1600) that utilizes an arbiter to arbitrate request signals. In another embodiment, system 1620 shown in FIG. 16B can include a controller 1624 that monitors conditions of an analog circuit 1622 using arbiter 1610. By way of example, analog circuit

1622 can output various analog signals representing various conditions such as parameters and/or flags relating to operating conditions, status, signal events, or other attributes relating to analog circuit 1622. The analog signals being outputted by analog circuit 1610 can be provided to arbiter 1610. Arbiter 1610 can arbitrate the analog signals such that controller 1624 can react to the earliest detected condition in the analog circuit 1622.

By way of example, in a single inductor multiple output (SIMO) DC-DC converter, the multiple outputs (e.g., N outputs) can be charged using only one inductor due to cost saving. Each output has an associated monitor to check if its voltage level is within the specification or needs to be charged. The various output monitors can be the clients (e.g., clients 1602) and the inductor can be the shared resource 1604, such that the arbiters described herein can arbitrate among the N output monitors to access the inductor. In another example for voltage converters, the arbiters described herein can also be used for interpreting which request or signals among the N outputs arrives first such that different actions can be performed depending on the order of arrival. For example, when a high-side metal-oxide-semiconductor field-effect transistor (MOSFET) is turned on, a pulse width modulation (PWM) comparator and an over-current comparator (e.g., for over current protection purposes) can be monitored. If the PWM comparator arrives first, arbiter 1610 can grant a signal corresponding to the PWM comparator to let controller 1624 know that the PWM comparator arrives first and then operation can remain normal. If the over current comparator arrives first, arbiter 1610 can grant a signal corresponding to the over current comparator to let controller 1624 know that the over-current comparator arrives first and controller 1624 may then take a corrective action such as switching off the high-side MOSFET and switching on the low-side MOSFET.

The arbiter 1610 can be scalable to arbitrary number of N inputs. As shown above in FIG. 1 to FIG. 6, a tree of OR2 gates for early propagation of requests can be utilized to scale arbiter 1610 to N≥2 inputs. Logic circuits 108 can be used for controlling two asynchronous circuits 104 and logic circuits 208, 308 can take the outputs of OR gates in the tree of OR gates. An N-inputs C-element along with inverters (e.g., inverters 114, 116) can detect the completion of set and reset phases. Note that the C-elements described herein can use monotonic protocol such that they can be decomposed into a tree of smaller C-elements. An N-inputs OR-gate (e.g., 110, 210, 310, 410, 510, 610) can be used for detecting a request has been granted and can produce the frc signal for asynchronous circuits 104. Also, the scaled arbiter can include N AND gates to detect the completion in the winning branch and produce a grant signal at the outputs of the arbiter. The number of OR gates in the tree of OR gates, the number of logic circuits 108, 208, 308, number of AND gates before the grant pins, the C-elements and the OR gate for generating frc signals, or other components, can be reused and/or scaled to scale arbiter 1610 to arbitrate N≥2 requests.

In one or more embodiments, arbiter 1610 can be scaled to arbitrate N inputs when N is not a power of 2. To determine the number of components to use for N inputs, where N is not a power of 2, an arbiter of $2^k$ inputs, where $2^k$≥N, can be constructed and thereafter refined to construct the arbiter of N inputs. In the $2^k$ input arbiter, identify at least one asynchronous circuit 104 among the $2^k$ copies of asynchronous circuits 104 that may be connected to redundant inputs and remove the identified at least one asynchronous circuit 104. At least one AND gate among the $2^k$ copies of AND gates connected to the grant pins can also be identified and removed. Then, iteratively perform 1) remove logic circuits 108 not connected to any signal at its r1 nor r2 inputs, 2) if a logic circuit 108 has only one of its r1 or r2 inputs, remove the logic circuit 108, connect CTRL to the corresponding wctrl pin and connect the input to a grant pin directly. Alternatively, remove the logic circuit 108, convert a copy of logic circuit 308 into a copy of logic circuit 208 and replace the removed logic circuit 108 with the newly converted logic circuit 208, 3) if a logic circuit 308 has neither r1 nor r2 inputs, remove it, 4) If a logic circuit 308 has only one of its r1 or r2 inputs, remove the logic circuit 308 and connect the input to a grant signal directly, 5) if the output of an AND gate or OR-gate has been disconnected, remove this gate, 6) if an AND gate, an OR gate or a C-element has some of the inputs disconnected, replace it by a smaller version of this gate, or if all inputs have been disconnected, remove the gate, or if only one input remains, remove the gate connecting its remaining input to its output. Other simplifications may be possible, as will be clear to one of ordinary skill or automatically performed by software tools. An example of an arbiter having N inputs with N not being a power of 2 is when N=7. See arbiter 400 in FIG. 4.

In one embodiment, an arbiter having a larger than necessary number of inputs can be reconfigured via firmware to scale to an arbiter with fewer inputs, such as by setting any redundant sig inputs to logic zero. By way of example, a N=8 arbiter can be configured to a N=5 arbiter by setting its inputs sig6=sig7=sig8=0 and using only sig1-sig5. If subsequently one needs to reconfigure it as a N=6 arbiter, then one can set sig7=sig8=0 and use sig1-sig6. Note that the setting of sig inputs to zero can be used on any subset of inputs, such as using any six sig inputs and setting the remaining 2 sig inputs to zero when N=6. The scaling via firmware can avoid changing the hardware of the arbiter since setting inputs to zero can be done externally.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a plurality of asynchronous circuits configured to:
receive a plurality of non-persistent signals representing a plurality of requests; and
sanitize the plurality of non-persistent signals to generate a plurality of persistent signals; and
at least one logic circuit configured to arbitrate the plurality of persistent signals, wherein each one of the at least one logic circuit comprises a mutual exclusive (MUTEX) circuit configured to arbitrate two signals, and wherein:
each one of at least one logic circuit is one of a first logic circuit, a second logic circuit and a third logic circuit, the first logic circuit, the second logic circuit and the third logic circuit being different from one another;
a number of copies of the first logic circuit is implemented in an initial level of arbitration; and
a number of copies of the second logic circuit and the third logic circuit are implemented in additional levels of arbitration.

2. The semiconductor device of claim 1, further comprising an OR gate configured to:
detect one of the requests is granted; and
in response to one of the plurality of requests being granted, generate a signal to reset the plurality of asynchronous circuits.

3. The semiconductor device of claim 2, further comprising at least one delay element configured to stagger the signal generated by the OR gate in order to stagger reset times of the plurality of asynchronous circuits.

4. The semiconductor device of claim 1, wherein when there are more than two requests among the plurality of requests, the semiconductor device comprises at least one OR gate configured to propagate at least two of the plurality of requests to logic circuit in the additional levels of arbitration while the initial level of arbitration is being performed.

5. The semiconductor device of claim 1, wherein:
the first logic circuit is configured to arbitrate two persistent signals outputted by two asynchronous circuits;
the second logic circuit is configured to arbitrate two persistent signals outputted by an OR gate and an asynchronous circuit; and
the third logic circuit is configured to arbitrate two persistent signals outputted by two OR gates.

6. The semiconductor device of claim 1, further comprising a C-element configured to:
detect a completion of arbitration performed by the at least one logic circuit; and
in response to detection of the completion of arbitration performed by the at least one logic circuit, output a signal to reset the at least one logic circuit.

7. The semiconductor device of claim 1, further comprising a plurality of AND gates configured to generate one grant signal for the plurality of requests based on arbitrations performed by the at least one logic circuit.

8. The semiconductor device of claim 1, wherein each one of the plurality of asynchronous circuits is configured to generate a persistent signal based on detection of one of:
high voltage level of an incoming non-persistent signal;
low voltage level of the incoming non-persistent signal;
rising edge of the incoming non-persistent signal; and
falling edge of the incoming non-persistent signal.

9. The semiconductor device of claim 1, wherein the number of copies of the first logic circuit, second logic circuit and the third logic circuit is dependent on the number of requests among the plurality of requests.

10. A system comprising:

an analog circuit;

a controller; and an arbiter comprising:

a plurality of asynchronous circuits configured to:

receive a plurality of non-persistent signals repre-
senting a plurality of requests; and sanitize the plurality of non-persistent signals to
generate a plurality of persistent signals; and at least one logic circuit configured to arbitrate the
plurality of persistent signals, wherein each one of
the at least one logic circuit comprises a mutual
exclusive (MUTEX) circuit configured to arbitrate
two signals, and wherein:

each one of at least one logic circuit is one of a first
logic circuit, a second logic circuit and a third
logic circuit, the first logic circuit, the second logic
circuit and the third logic circuit being different
from one another;

a number of copies of the first logic circuit is
implemented in an initial level of arbitration; and a number of copies of the second logic circuit and the
third logic circuit are implemented in additional
levels of arbitration, wherein the controller is configured to control the analog
circuit based on arbitration of the plurality of persistent
signals.

11. The system of claim 10, wherein the arbiter further
comprises an OR gate configured to:

detect one of the plurality of requests is granted; and in response to one of the plurality of requests being
granted, generate a signal to reset the plurality of
asynchronous circuits.

12. The system of claim 11, wherein the arbiter further
comprises at least one delay element configured to stagger
the signal generated by the OR gate in order to stagger reset
times of the plurality of asynchronous circuits.

13. The system of claim 10, wherein when there are more
than two requests among the plurality of requests, the arbiter
comprises at least one OR gate configured to propagate at
least two of the plurality of requests to the at least one logic
circuit in the additional levels of arbitration while the initial
level of arbitration is being performed.

14. The system of claim 10, wherein:

the first logic circuit is configured to arbitrate two per-
sistent signals outputted by two asynchronous circuits;

the second logic circuit is configured to arbitrate two
persistent signals outputted by an OR gate and a
asynchronous circuit; and the third logic circuit is configured to arbitrate two
persistent signals outputted by two OR gates.

15. The system of claim 10, wherein the arbiter further
comprises a C-element configured to:

detect a completion of arbitration performed by the at
least one logic circuit; and in response to detection of the completion of arbitration
performed by the at least one logic circuit, output a
signal to reset the at least one logic circuit.

16. The system of claim 10, wherein the arbiter further
comprises a plurality of AND gates configured to generate
one grant signal for the plurality of requests based on
arbitrations performed by the at least one logic circuit.

17. The system of claim 10, wherein the number of copies
of the first logic circuit, second logic circuit and the third
logic circuit is dependent on the number of requests among
the plurality of requests.

18. A semiconductor device comprising:

a plurality of input pins configured to receive a plurality
of non-persistent signals representing a plurality of
requests;

a plurality of asynchronous circuits configured to sanitize
the plurality of non-persistent signals to generate a
plurality of persistent signals;

at least one logic circuit configured to arbitrate the plu-
rality of persistent signals, wherein each one of the at
least one logic circuit comprises a mutual exclusive
(MUTEX) circuit configured to arbitrate two signals;

a C-element configured to:

detect a completion of arbitration performed by the at
least one logic circuit; and in response to detection of the completion of arbitration
performed by the at least one logic circuit, output a
signal to reset the at least one logic circuit;

a plurality of grant pins, wherein arbitration of the plu-
rality of persistent signals causes one of the grant pins
to output a grant signal; and an OR gate configured to:

detect one of the grant pins outputted the grant signal;
and in response to detection of one of the grant pins
outputted the grant signal, generate a signal to reset
the plurality of asynchronous circuits.

19. The semiconductor device of claim 18, wherein:

the at least one logic circuit comprises at least one of a
first logic circuit, a second logic circuit and a third logic
circuit, the first logic circuit, the second logic circuit
and the third logic circuit being different from one
another;

a number of copies of the first logic circuit is implemented
in an initial level of arbitration;

a number of copies of the second logic circuit and the
third logic circuit are implemented in additional levels
of arbitration; and the number of copies of the first logic circuit, second logic
circuit and the third logic circuit is dependent on the
number of requests among the plurality of requests.

20. The semiconductor device of claim 18, wherein when
there are more than two requests among the plurality of
requests, the semiconductor device comprises at least one
OR gate configured to propagate at least two of the plurality
of requests to the at least one logic circuit in additional levels
of arbitration while an initial level of arbitration is being
performed.

* * * * *